(12) United States Patent
Itano et al.

(10) Patent No.: US 11,170,855 B2
(45) Date of Patent: Nov. 9, 2021

(54) SEMICONDUCTOR DEVICE AND MANUFACTURING METHOD OF THE SAME

(71) Applicant: KIOXIA CORPORATION, Tokyo (JP)

(72) Inventors: Yuka Itano, Yokkaichi Mie (JP); Minoru Oda, Yokkaichi Mie (JP); Masato Shini, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/008,789

(22) Filed: Sep. 1, 2020

(65) Prior Publication Data

US 2021/0074362 A1 Mar. 11, 2021

(30) Foreign Application Priority Data

Sep. 10, 2019 (JP) .............................. JP2019-164884

(51) Int. Cl.
| | |
|---|---|
| *G11C 16/08* | (2006.01) |
| *G11C 7/18* | (2006.01) |
| *G11C 8/14* | (2006.01) |
| *H01L 27/11526* | (2017.01) |
| *H01L 27/11565* | (2017.01) |
| *H01L 27/11553* | (2017.01) |
| *H01L 27/1158* | (2017.01) |

(52) U.S. Cl.
CPC .............. *G11C 16/08* (2013.01); *G11C 7/18* (2013.01); *G11C 8/14* (2013.01); *H01L 27/1158* (2013.01); *H01L 27/11526* (2013.01); *H01L 27/11553* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 8,681,556 | B2 | 3/2014 | Kutsukake |
| 8,846,508 | B1 | 9/2014 | England |
| 10,211,166 | B2 | 2/2019 | Matsuo |
| 2015/0200134 | A1* | 7/2015 | Yang ................... H01L 29/7824 257/371 |
| 2017/0069731 | A1 | 3/2017 | Kim |
| 2017/0092654 | A1 | 3/2017 | Nishikawa |
| 2018/0374864 | A1 | 12/2018 | Fukuzumi |
| 2019/0096900 | A1 | 3/2019 | Matsuo |
| 2021/0082873 | A1* | 3/2021 | Chen ....................... H01L 24/03 |

* cited by examiner

*Primary Examiner* — Tan T. Nguyen
(74) *Attorney, Agent, or Firm* — Foley & Lardner LLP

(57) ABSTRACT

A semiconductor device according to an embodiment includes first and second chips, and a first conductor. The first chip includes a first substrate, a first circuit and a first joint metal. The first circuit is provided on the first substrate. The first joint metal is connected to the first circuit. The second chip includes a second substrate, a second circuit, and a second joint metal. The second substrate includes P-type and N-type well regions. The second circuit is provided on the second substrate and includes a first transistor. The second joint metal is connected to the second circuit and the first joint metal. The first conductor is connected to the N-type well region from a top region of the second chip. The P-type well region is arranged between a gate electrode of the first transistor and the N-type well region.

20 Claims, 23 Drawing Sheets

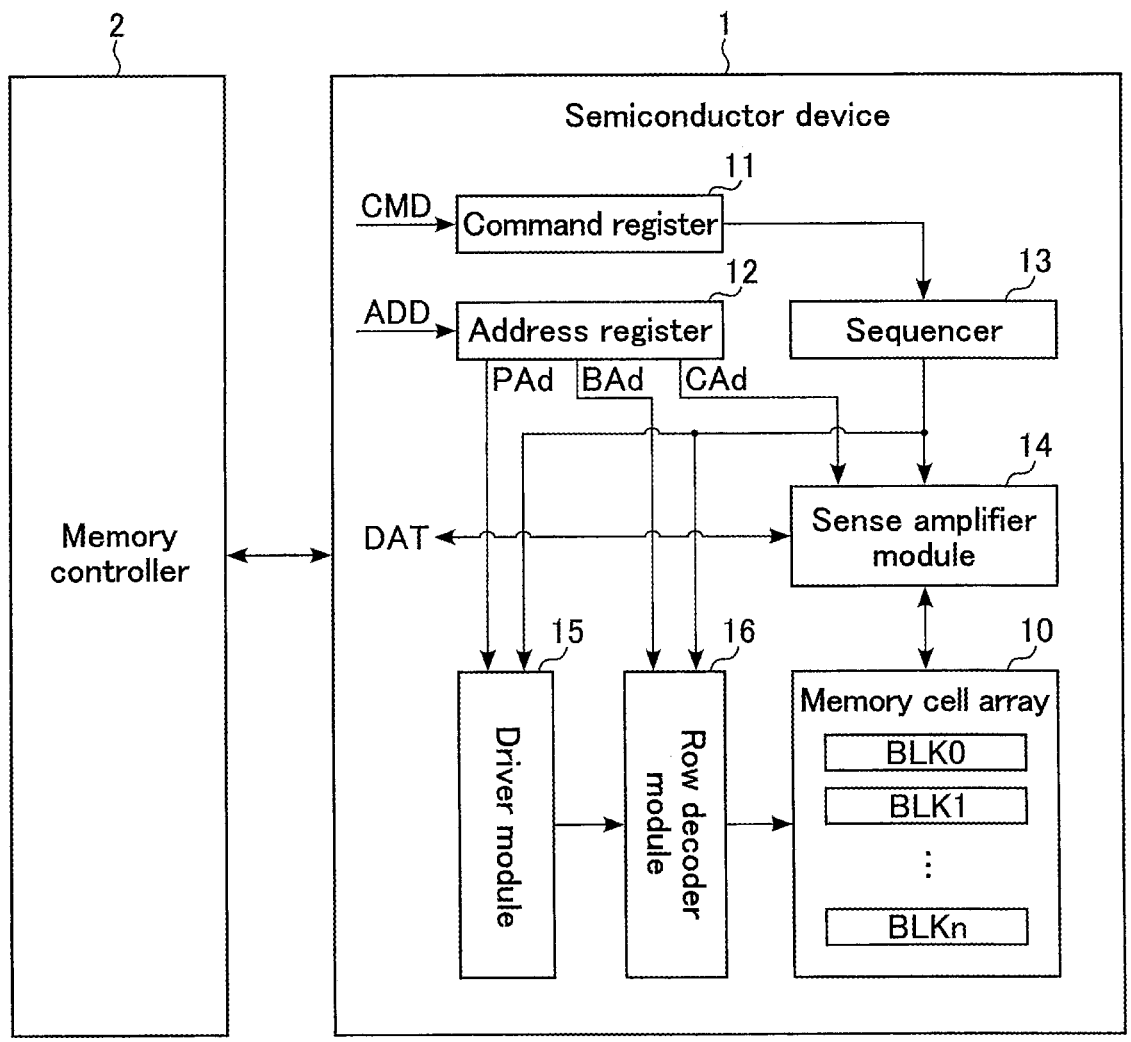
F I G. 1

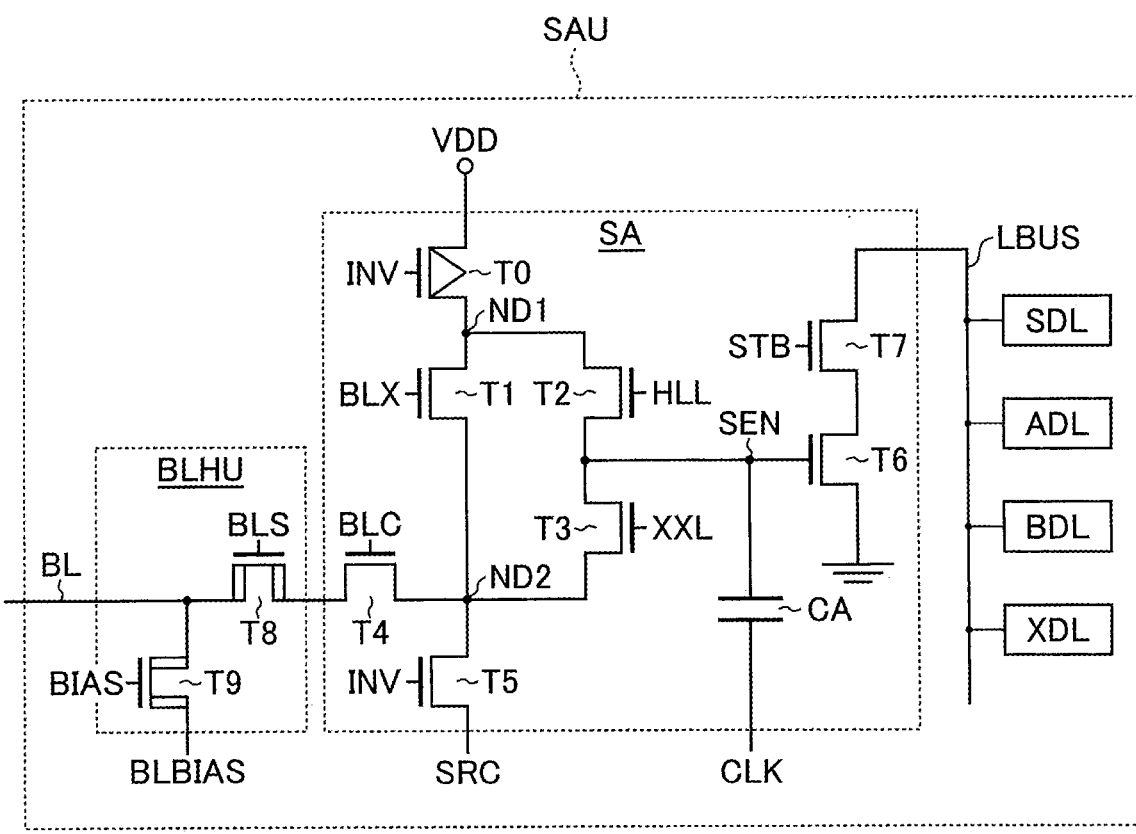
F I G. 4

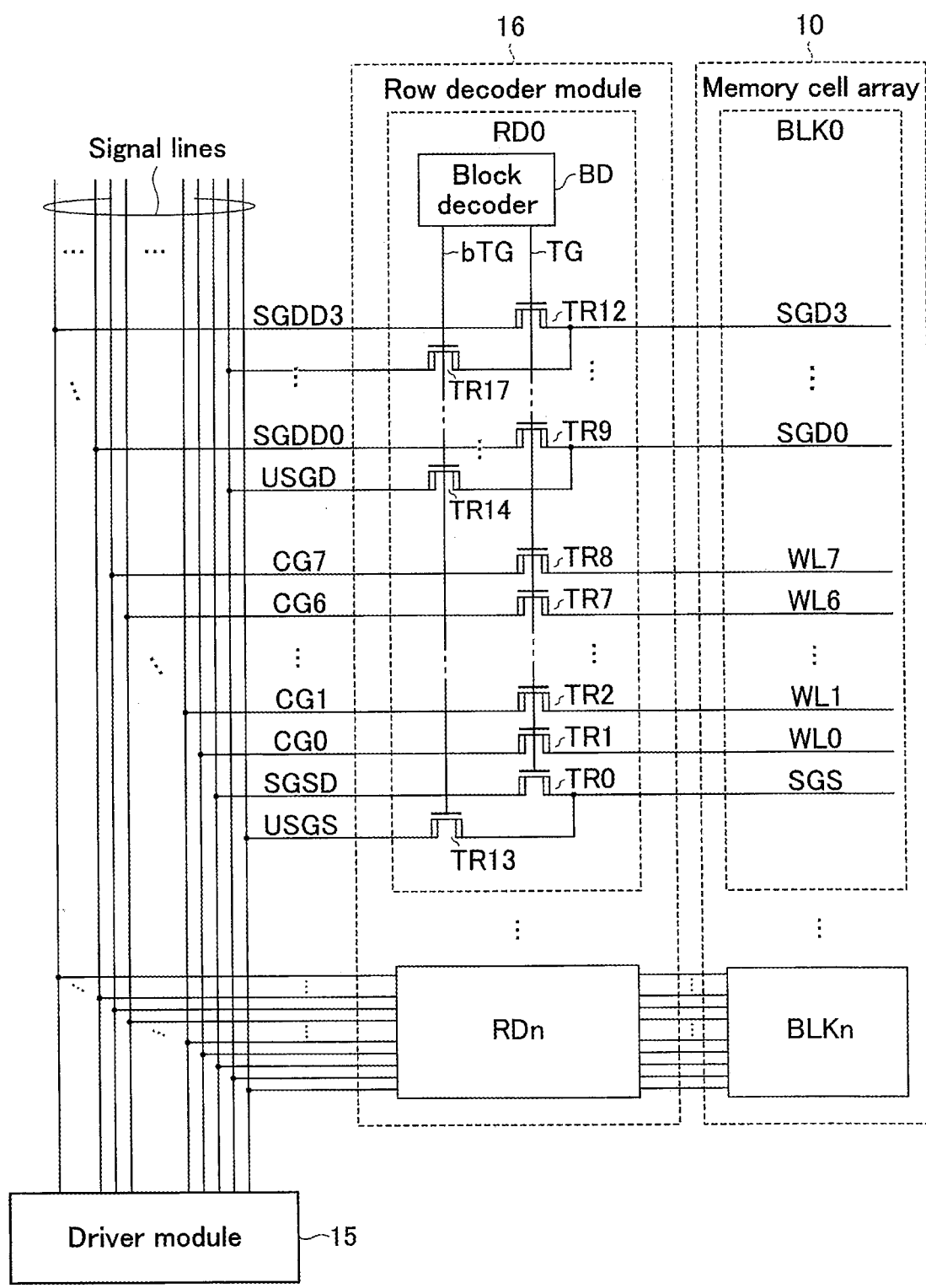
F I G. 5

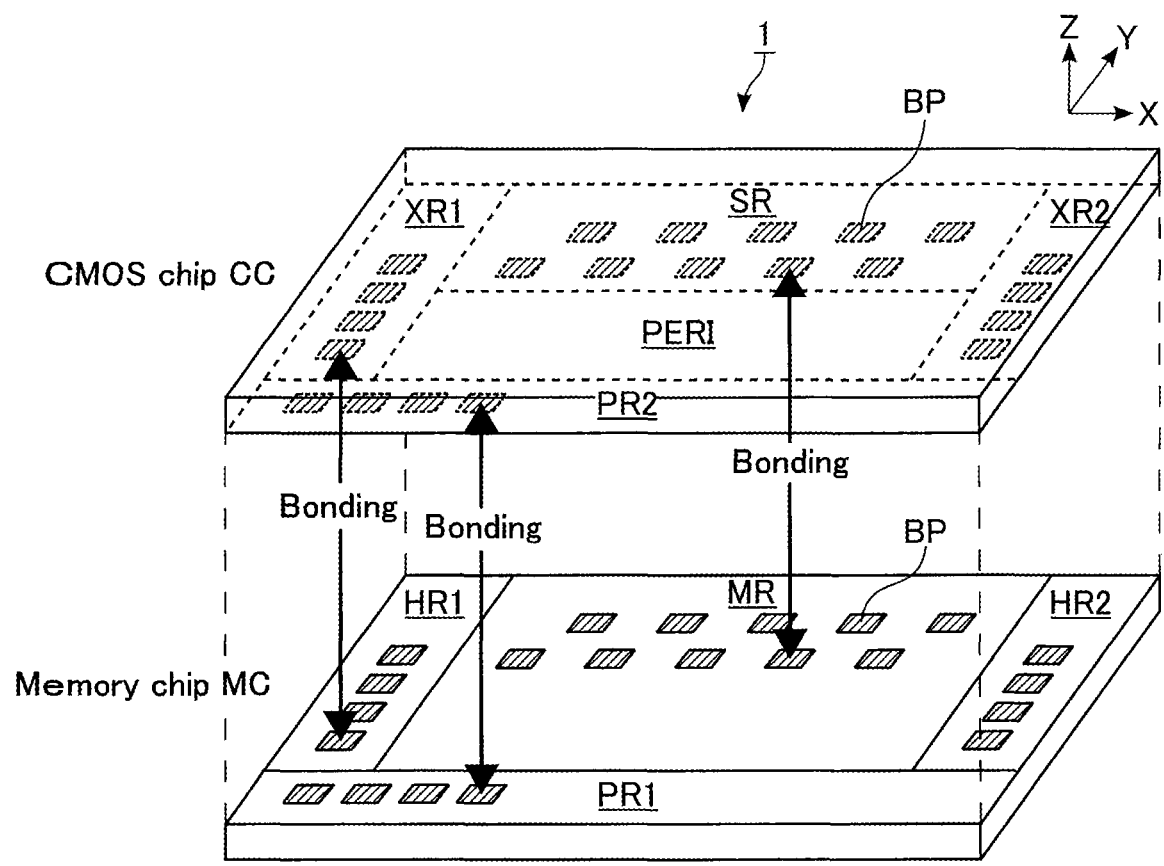
F I G. 6

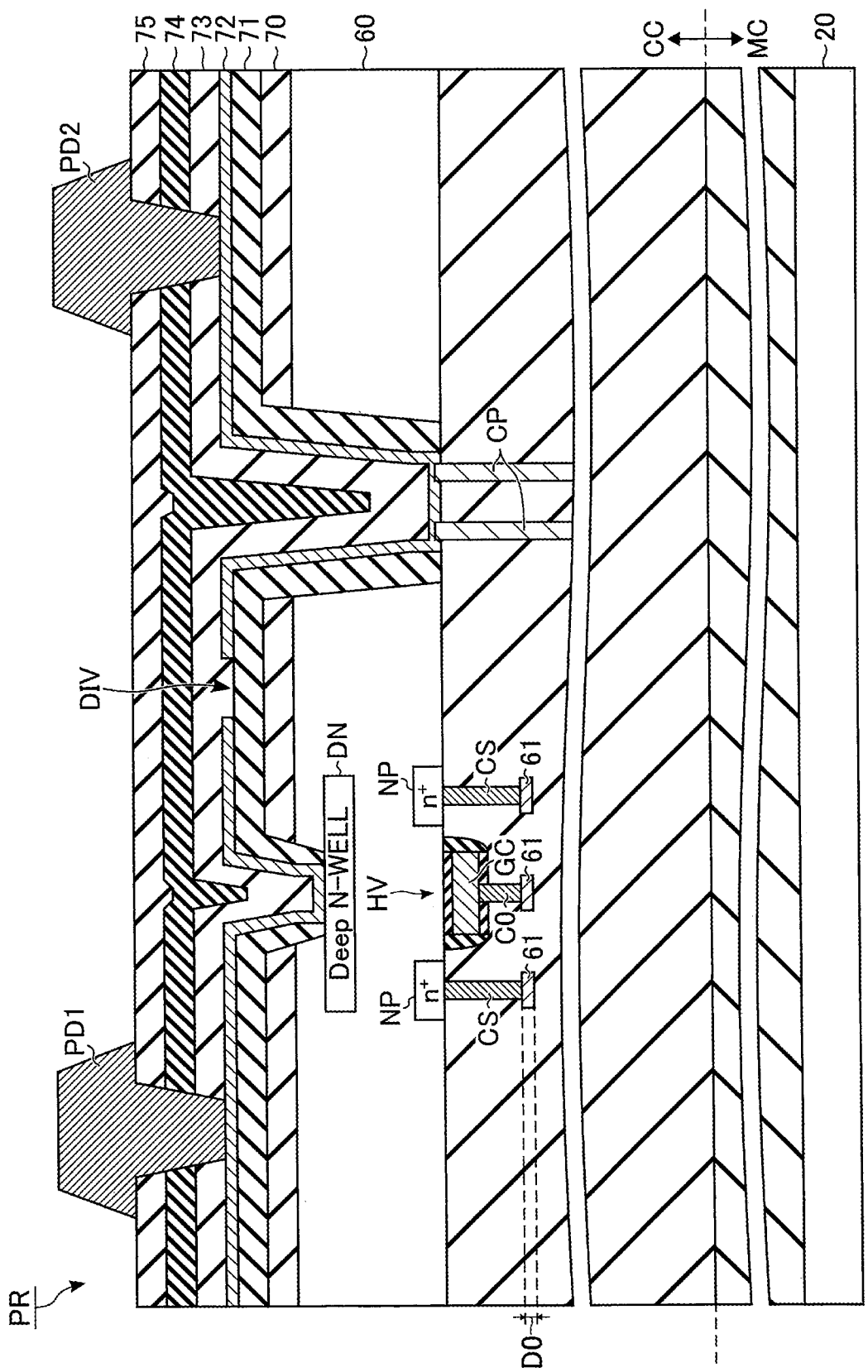
F I G. 10

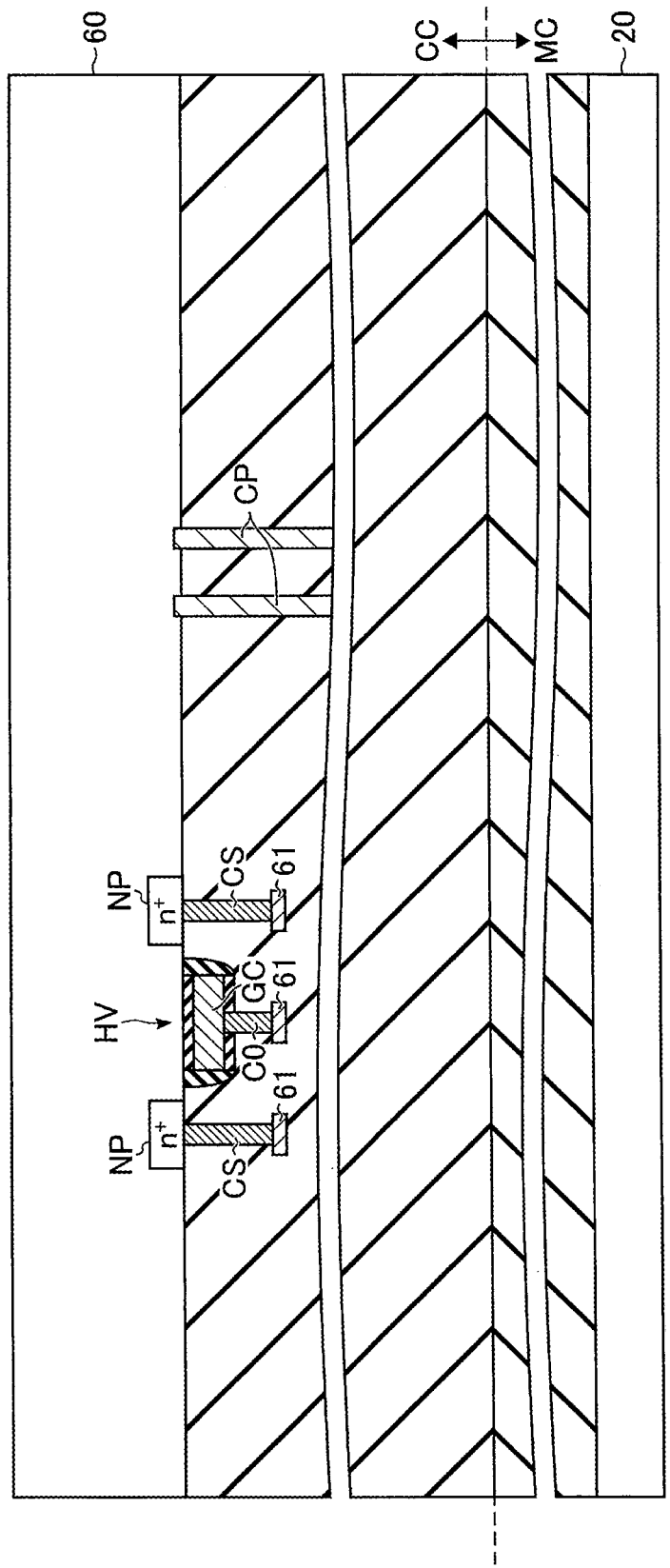
F I G. 12

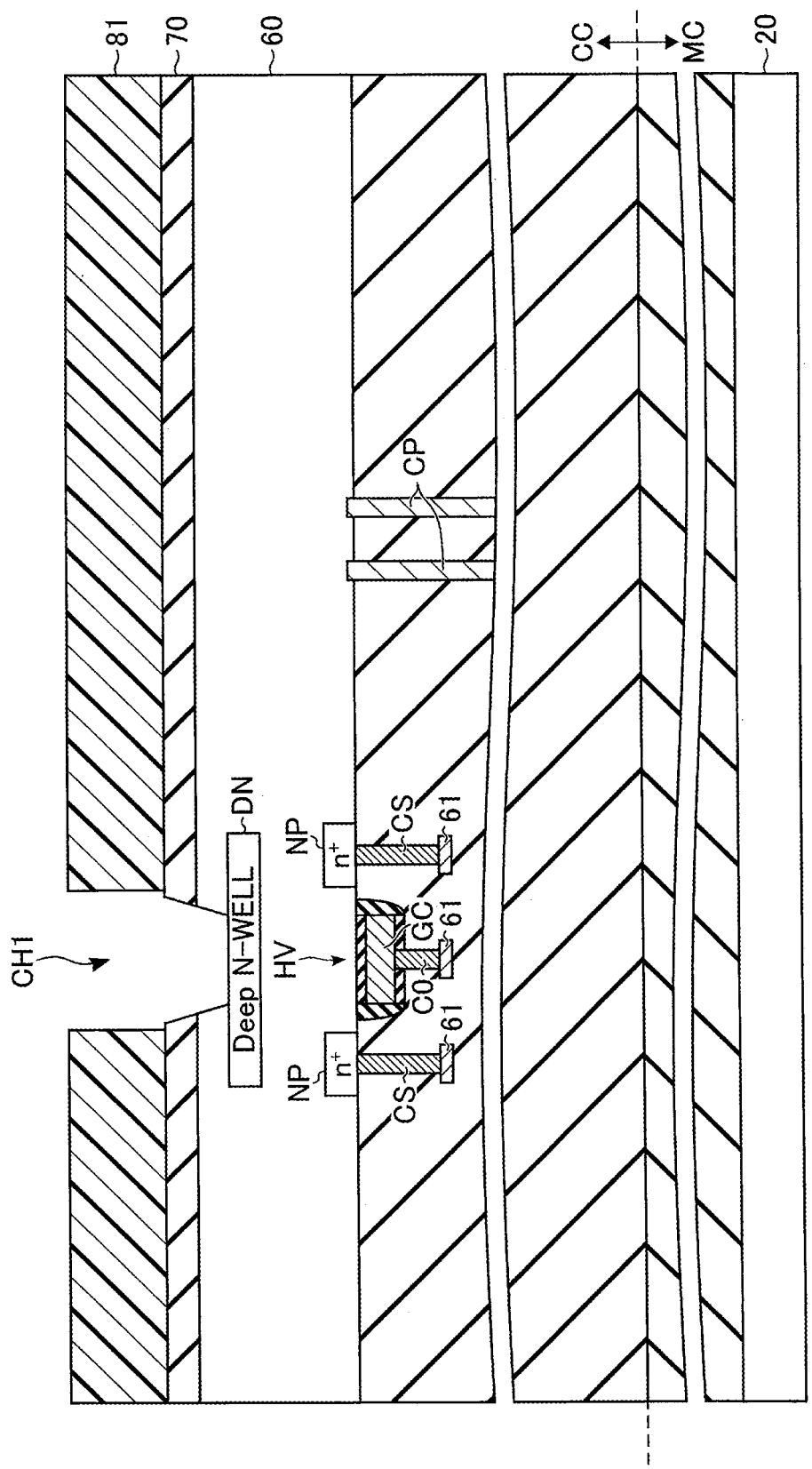
F I G. 15

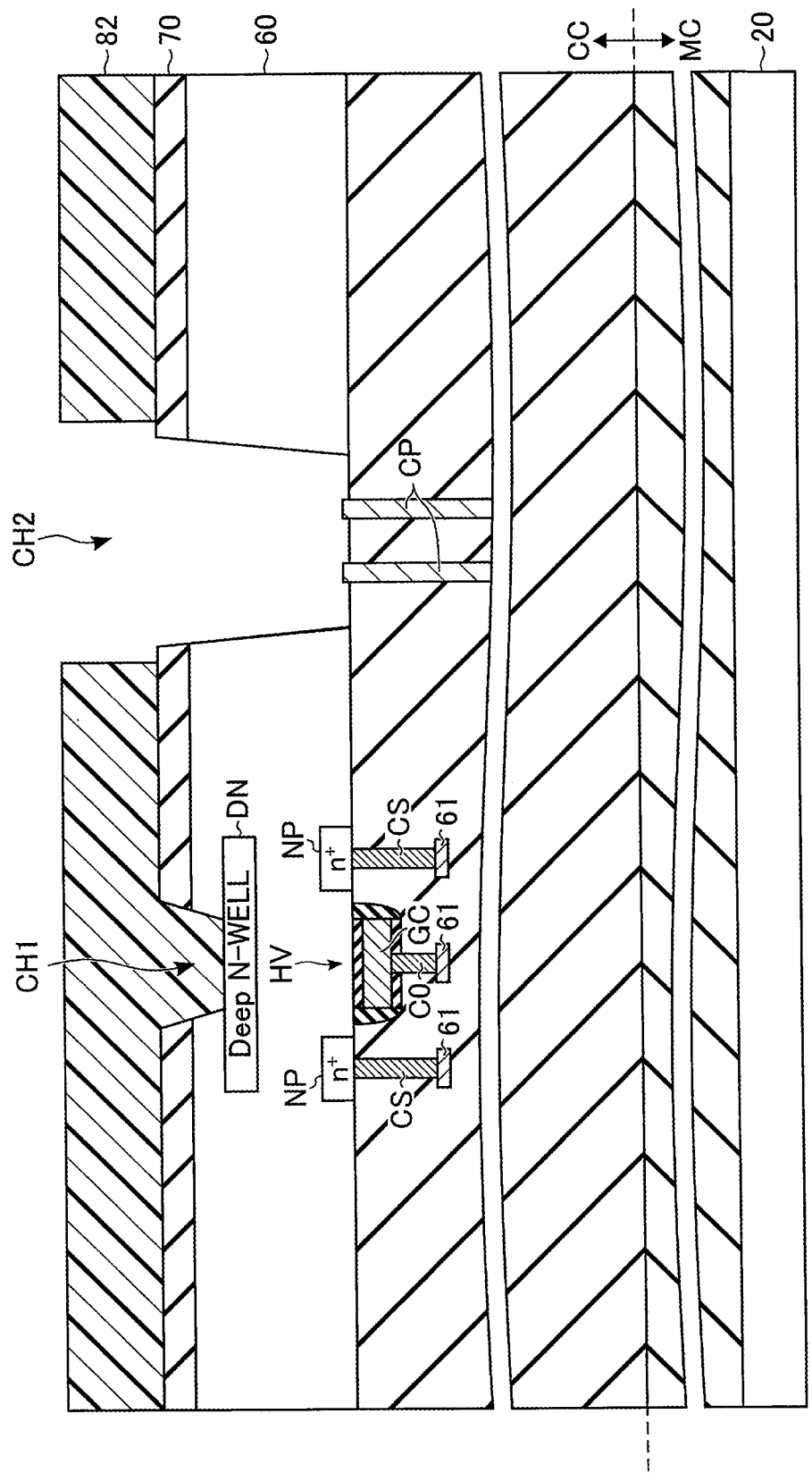
F I G. 16

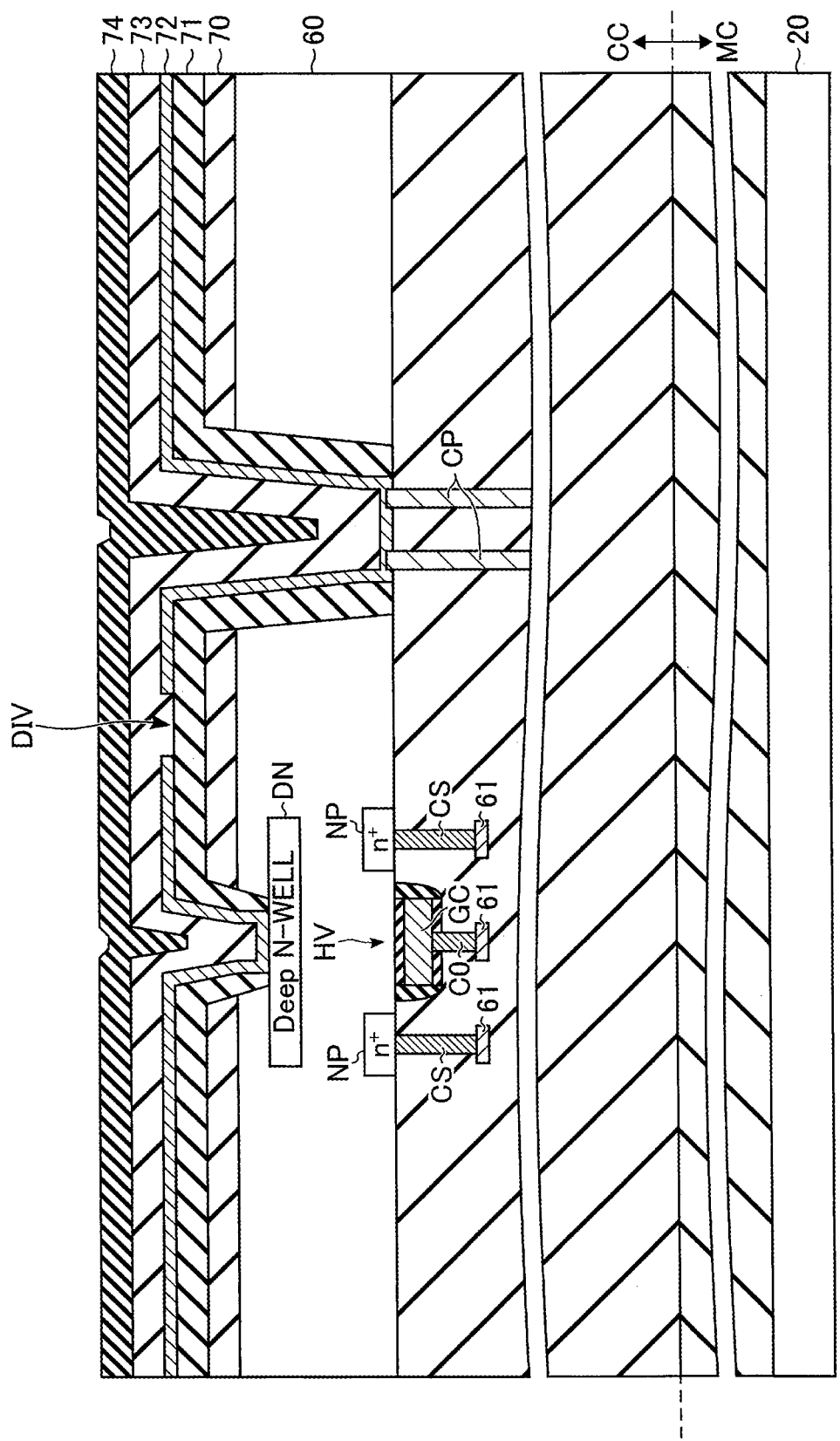
F I G. 20

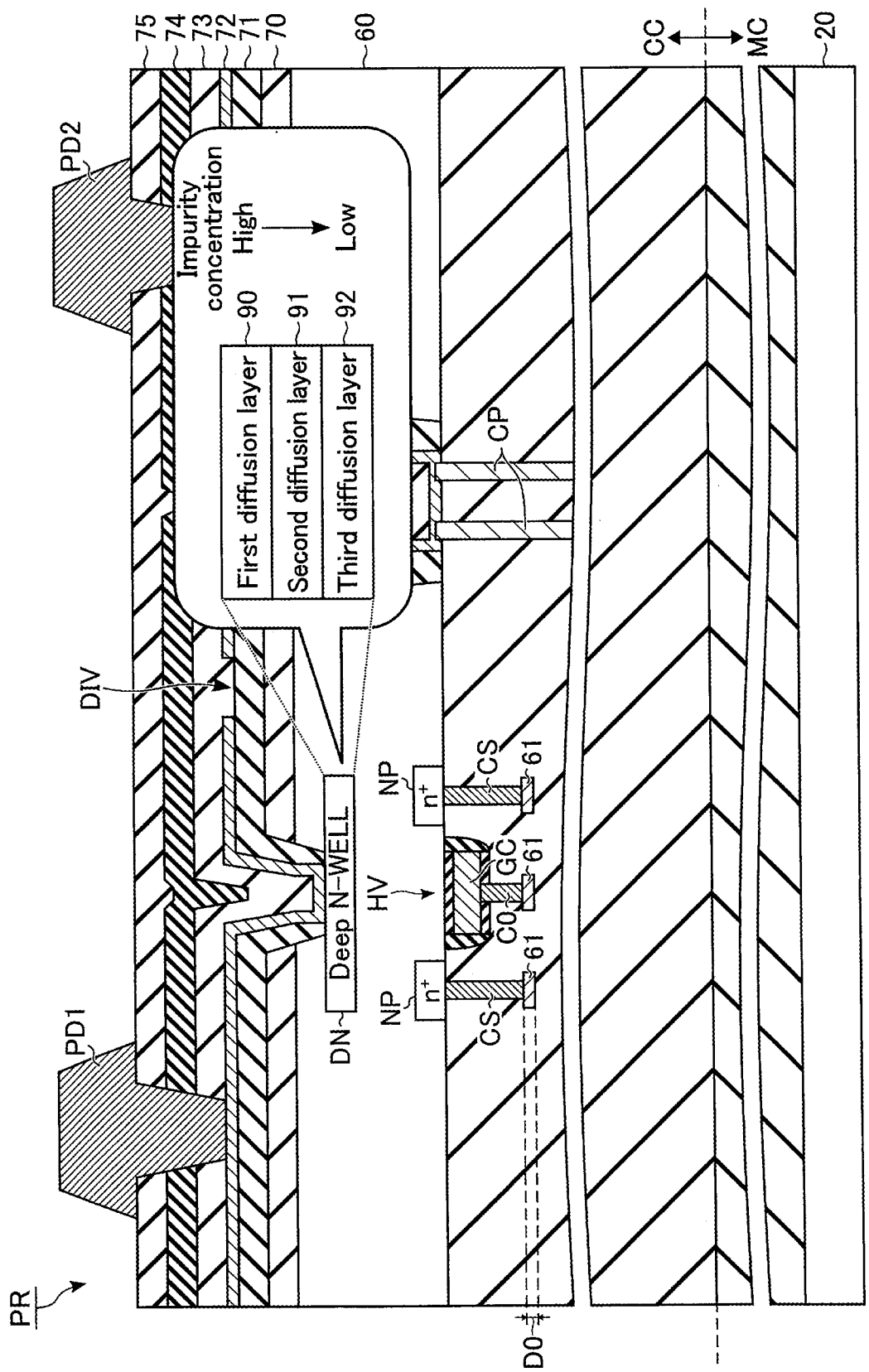
F I G. 23 ered by an external memory controller 2. The semiconductor device 1 may include a memory cell array 10, a command register 11, an address register 12, a sequencer 13, a sense amplifier module 14, a driver module 15, and a row decoder module 16.

SEMICONDUCTOR DEVICE AND MANUFACTURING METHOD OF THE SAME

CROSS-REFERENCE TO RELATED APPLICATIONS

This application is based upon and claims the benefit of priority from Japanese Patent Application No. 2019-164884, filed Sep. 10, 2019, the entire contents of which are incorporated herein by reference.

FIELD

The present embodiment relates to a semiconductor device and the manufacturing method of the same.

BACKGROUND

A NAND flash memory has been known as a storage for storing data in a nonvolatile manner.

BRIEF DESCRIPTION OF THE DRAWINGS

FIG. 1 is a block diagram of a semiconductor device according to an embodiment.

FIG. 4 is a circuit diagram showing an exemplary circuit structure of a sense amplifier unit in the semiconductor device according to the embodiment.

FIG. 5 is a circuit diagram showing an exemplary circuit structure of a row decoder module in the semiconductor device according to the embodiment.

FIG. 6 is a perspective view of an exemplary structure of the semiconductor device according to the embodiment.

FIG. 10 is a cross-sectional view of a cross-section of a pad region in the semiconductor device according to the embodiment.

FIGS. 12 to 21 are cross-sectional views of exemplary cross-sections of the semiconductor device according to the embodiment in the manufacturing process.

FIG. 23 is a cross-sectional view of an exemplary cross-section of a pad region of a semiconductor device according to a modification example of the embodiment.

DETAILED DESCRIPTION

Figure 2:
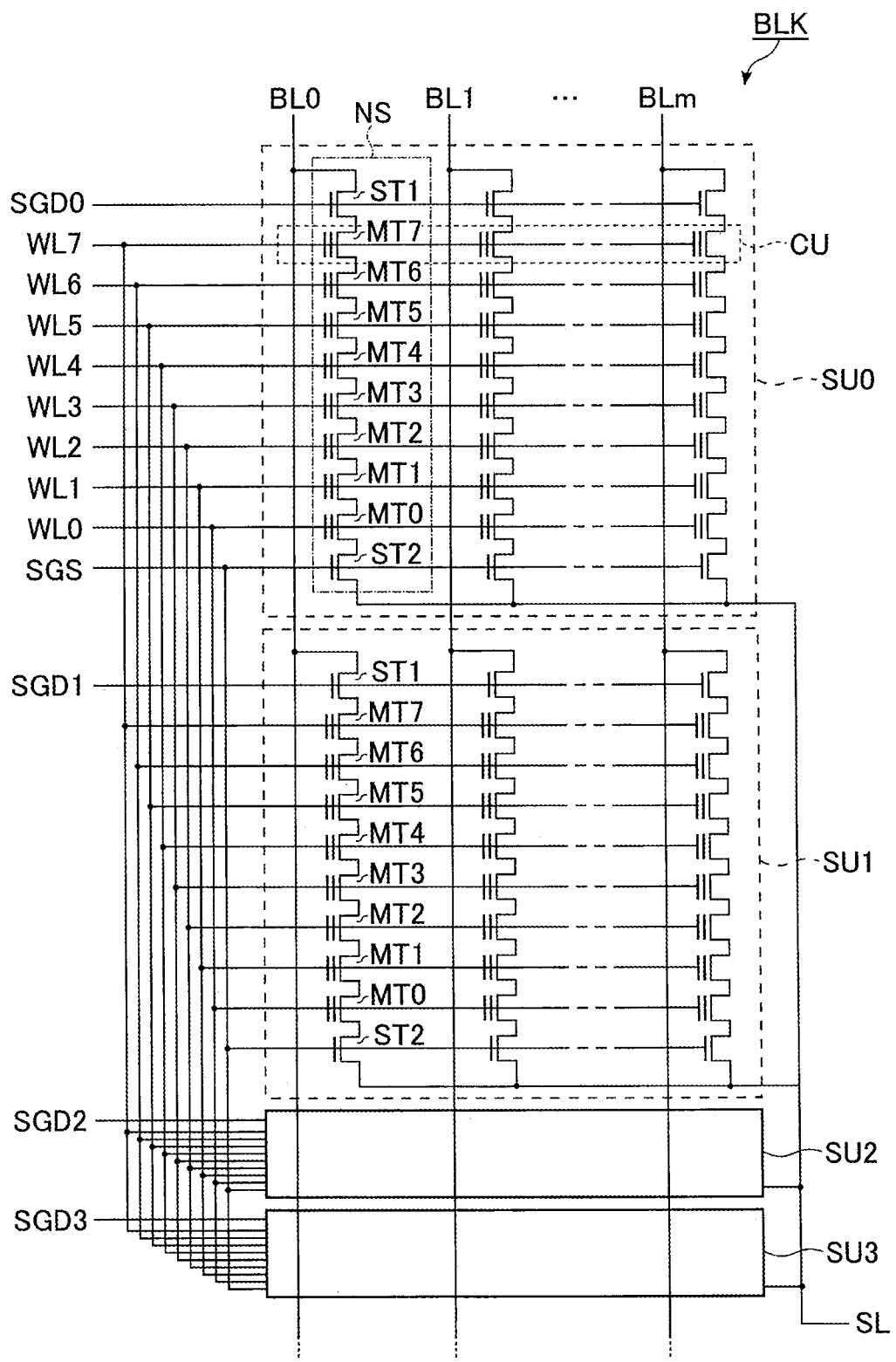
FIG. 2 is a circuit diagram of a memory cell array in the semiconductor device according to the embodiment.

In general, according to one embodiment, a semiconductor device includes a first chip, a second chip, and a first conductor. The first chip includes a first substrate, a first circuit and a first joint metal. The first circuit is provided on the first substrate. The first joint metal is connected to the first circuit. The second chip provided on the first chip. The second chip includes a second substrate, a second circuit, and a second joint metal. The second substrate includes a P-type well region and an N-type well region. The second circuit is provided on the second substrate and includes a first transistor. The second joint metal is connected to the second circuit and the first joint metal. The first conductor is connected to the N-type well region from a top region of the second chip. The P-type well region is arranged between a gate electrode of the first transistor and the N-type well region.

The embodiments will be explained below by referring to the drawings. The embodiments exemplify a device and method that realize the technical concept of the invention. The drawings are provided merely for schematic or conceptual purposes, and thus may not be identical to the actual dimensions and proportions. Furthermore, the technical concept of the invention is not limited by the form, structure, arrangement or the like of the structural components.

In the following explanation, structural components having basically the same functions and structures will be referred to by the same reference symbols. The reference symbols may contain a character string and numerals attached to the character string. When reference symbols containing the same character string are referenced, the corresponding components have the same structure, and are distinguished from each other by the numerals attached to the character strings. When components having reference symbols containing the same character string need not be distinguished from each other, these components may be referred to by a reference symbol containing the character string only.

[1] Embodiment

A semiconductor device 1 according to the embodiment is configured by adhering a plurality of chips. In the following explanation, a NAND flash memory capable of storing data in a nonvolatile manner will be discussed as an example of the semiconductor device 1 according to the embodiment.

[1-1] Structure of Semiconductor Device 1

[1-1-1] Overall Structure of Semiconductor Device 1

FIG. 1 shows an exemplary structure of the semiconductor device 1 according to the embodiment. As illustrated in FIG. 1, the semiconductor device 1 may be controlled by an external memory controller 2. The semiconductor device 1 may include a memory cell array 10, a command register 11, an address register 12, a sequencer 13, a sense amplifier module 14, a driver module 15, and a row decoder module 16.

The memory cell array 10 includes a plurality of blocks BLK0 to BLKn (where n is an integer larger than or equal to 1). A block BLK is a set of memory cells that can store data in a nonvolatile manner, and may be used as a data erase unit. The memory cell array 10 is provided with a plurality of bit lines and word lines. Each memory cell is associated with one bit line and one word line.

The command register 11 holds a command CMD that the semiconductor device 1 receives from the memory controller 2. A command CMD may include commands for causing the sequencer 13 to read, write, erase, and the like.

The address register 12 holds address information ADD that the semiconductor device 1 receives from the memory controller 2. The address information ADD may include a block address BAd, a page address PAd, and a column address CAd. The block address BAd, page address PAd, and column address CAd may be used for selection of a block BLK, a word line, and a bit line, respectively.

The sequencer 13 controls the overall operation of the semiconductor device 1. For example, the sequencer 13 may control the sense amplifier module 14, driver module 15, row decoder module 16, and the like based on a command CMD held in the command register 11, and thereby implement a read operation, write operation, erase operation or the like.

In a write operation, the sense amplifier module 14 applies targeted voltages to the bit lines in accordance with the write data DAT received from the memory controller 2. In a read operation, the sense amplifier module 14 determines data stored in a memory cell based on the voltages of the bit lines, and transfers the determination result as the read-out data DAT to the memory controller 2.

The driver module 15 generates voltages to be used for the read operation, write operation, and erase operation. The driver module 15 then applies a generated voltage to the signal line corresponding to the selected word line, for example based on the page address PAd held in the address register 12.

The row decoder module 16 selects one of the blocks BLK in a memory cell array 10 based on the block address BAd held in the address register 12. Thereafter, the row decoder module 16 transfers the voltage applied to the signal line corresponding to the selected word line, to this selected word line in the selected block BLK.

The above-mentioned semiconductor device 1 and memory controller 2 may be combined into a single semiconductor device. Examples of such semiconductor devices include a memory card such as an SD™ card and a solid state drive (SSD).

[1-1-2] Circuit Structure of Semiconductor Device 1
(Circuit Structure of Memory Cell Array 10)

FIG. 2 illustrates an exemplary circuit structure of the memory cell array 10 in the semiconductor device 1 according to the embodiment, focusing on one of the blocks BLK included in the memory cell array 10. As illustrated in FIG. 2, a block BLK may contain four string units SU0 to SU3.

Each of the string units SU includes a plurality of NAND strings NS, each associated with one of bit lines BL0 to BLm (where m is an integer greater than or equal to 1). Each NAND string NS includes memory cell transistors MT0 to MT7 and selection transistors ST1 and ST2. A memory cell transistor MT includes a control gate and a charge storage layer, and stores the data in a nonvolatile manner. Each of the selection transistors ST1 and ST2 is used for selection of a string unit SU in various operations.

In each of the NAND strings NS, memory cell transistors MT0 to MT7 are connected in series with each other. The drain of the selection transistor ST1 is connected directly to the associated bit line BL, while the source of the selection transistor ST1 is connected to one end of the memory cell transistors MT0 to MT7 that are connected in series. The drain of the selection transistor ST2 is connected to the other end of the memory cell transistors MT0 to MT7 that are connected in series. The source of the selection transistor ST2 is connected to a source line SL.

Within a block BLK, the control gates of the memory cell transistors MT0 to MT7 are commonly connected to the corresponding one of the word lines WL0 to WL7. The gates of the selection transistors ST1 in each of the string units SU0 to SU3 are commonly connected to the corresponding one of the selection gate lines SGD0 to SGD3. The gates of the selection transistors ST2 within a block BLK are commonly connected to the selection gate line SGS.

Different column addresses are assigned to the bit lines BL0 to BLm. Each bit line BL is shared by the NAND strings NS to which the same column address is assigned among a plurality of blocks BLK. A set of word lines WL0 to WL7 is provided for each block BLK, while the source line SL is shared over a plurality of blocks BLK.

A set of memory cell transistors MT commonly connected to a word line WL in one string unit SU may be referred to as a cell unit CU. The storage capacity of a cell unit CU including the memory cell transistors MT, which each stores, for example, 1-bit data, is defined as "1-page data". The cell unit CU may have a storage capacity of 2-page data or more in accordance with the number of bits of the data stored in the memory cell transistors MT.

The circuit structure of the memory cell array 10 in the semiconductor device 1 according to the embodiment is not limited to the above-mentioned structure. The number of string units SU in a block BLK and the numbers of memory cell transistors MT and selection transistors ST1 and ST2 in a NAND string NS may be freely determined.

(Circuit Structure of Sense Amplifier Module 14)

Figure 3:
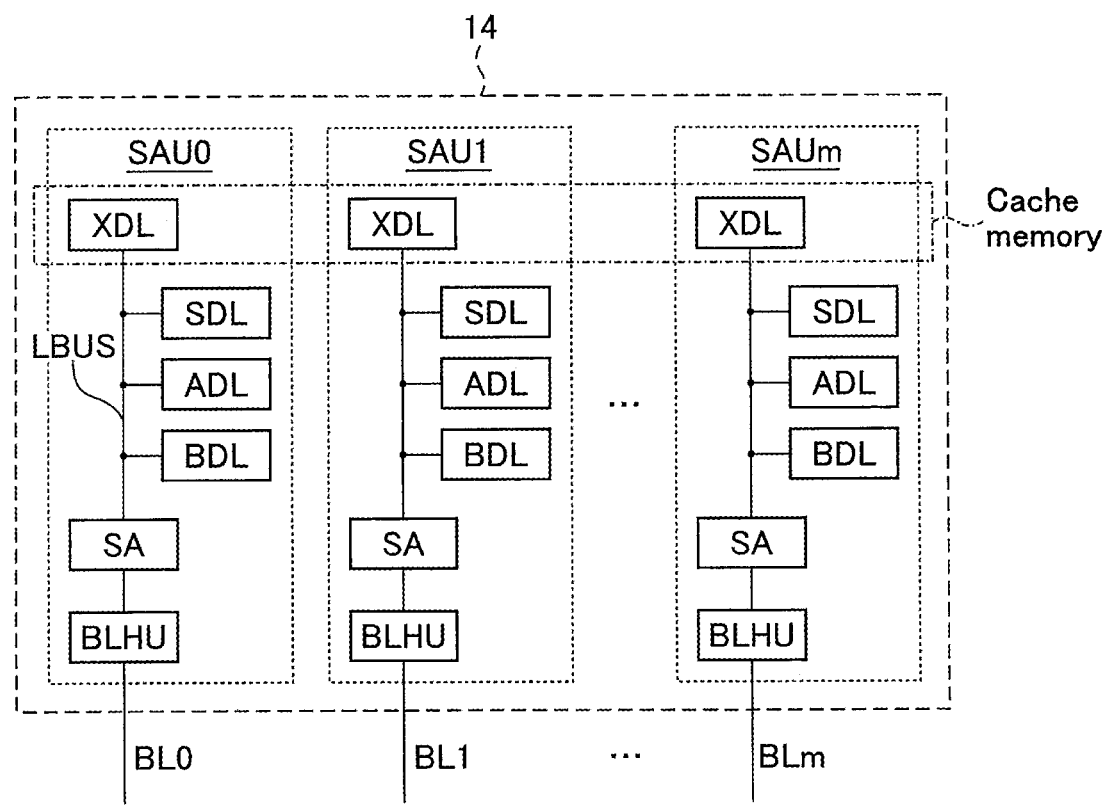
FIG. 3 is a circuit diagram showing an exemplary circuit structure of a sense amplifier module in the semiconductor device according to the embodiment.

FIG. 3 shows an exemplary circuit structure of the sense amplifier module 14 in the semiconductor device 1 according to the embodiment. As illustrated in FIG. 3, the sense amplifier module 14 may include sense amplifier units SAU0 to SAUm. The sense amplifier units SAU0 to SAUm are respectively associated with the bit lines BL0 to BLm. Each sense amplifier unit SAU may include a bit line connection section BLHU, a sense amplification section SA, a bus LBUS, and latch circuits SDL, ADL, BDL and XDL.

The bit line connection section BLHU is arranged between and connected to the associated bit line BL and sense amplification section SA. In a read operation, the sense amplification section SA determines whether the read data is "0" or "1", based on the voltage of the associated bit line BL. That is, the sense amplification section SA senses the data that is read out to the associated bit line BL, and thereby determines the data stored in the selected memory cell. Each of the latch circuits SDL, ADL, BDL and XDL temporarily stores the read data and write data.

The sense amplification section SA and latch circuits SDL, ADL, BDL and XDL are independently connected to the bus LBUS so that the data can be mutually transmitted and received via the bus LBUS. The latch circuit XDL is connected to an input/output circuit (not shown) so as to be used for input/output of data between the sense amplifier unit SAU and the input/output circuit. The latch circuit XDL may also be used as a cache memory of the semiconductor device 1. For instance, even if the latch circuits SDL, ADL and BDL are currently in use, the semiconductor device 1 can be placed in a ready state if the latch circuit XDL is not busy.

FIG. 4 shows an exemplary circuit structure of the sense amplifier unit SAU in the semiconductor device 1 according to the embodiment. As illustrated in FIG. 4, the sense amplification section SA may include transistors T0 to T7 and a capacitor CA, and the bit line connection section BLHU may include transistors T8 and T9.

The transistor T0 is a P-type MOS transistor. Each of the transistors T1 to T7 is an N-type MOS transistor. Each of the transistors T8 and T9 is an N-type MOS transistor having a higher breakdown voltage than any of the transistors T0 to T7. In the following description, the transistors T0 to T7 may be referred to as low breakdown voltage transistors, and the transistors T8 and T9 may be referred to as high breakdown voltage transistors.

The source of the transistor T0 is connected to a power supply line. The drain of the transistor T0 is connected to a node ND1. The gate of the transistor T0 may be connected to a node INV of the latch circuit SDL. The drain of the transistor T1 is connected to the node ND1. The source of the transistor T1 is connected to a node ND2. A control signal BLX is input to the gate of the transistor T1. The drain of the transistor T2 is connected to the node ND1. The source of the transistor T2 is connected to a node SEN. A control signal HLL is input to the gate of the transistor T2.

The drain of the transistor T3 is connected to the node SEN. The source of the transistor T3 is connected to the node ND2. A control signal XXL is input to the gate of the transistor T3. The drain of the transistor T4 is connected to the node ND2. A control signal BLC is input to the gate of the transistor T4. The drain of the transistor T5 is connected to the node ND2. The source of the transistor T5 is connected to a node SRC. The gate of the transistor T5 may be connected to the node INV in the latch circuit SDL.

The source of the transistor T6 is grounded. The gate of the transistor T6 is connected to the node SEN. The drain of the transistor T7 is connected to the bus LBUS. The source of the transistor T7 is connected to the drain of the transistor T6. A control signal STB is input to the gate of the transistor T7. One electrode of the capacitor CA is connected to the node SEN. A clock CLK is input to the other electrode of the capacitor CA.

The drain of the transistor T8 is connected to the source of the transistor T4. The source of the transistor T8 is connected to the bit line BL. A control signal BLS is input to the gate of the transistor T8. The drain of the transistor T9 is connected to a node BLBIAS. The source of the transistor T9 is connected to the bit line BL. A control signal BIAS is input to the gate of the transistor T9.

In the above-discussed circuit structure of the sense amplifier unit SAU, a power supply voltage VDD may be applied to the power supply line connected to the source of the transistor T0. A ground voltage VSS may be applied to the node SRC. An erase voltage VERA is applied to the node BLBIAS. Each of the control signals BLX, HLL, XXL, BLC, STB, BLS, and BIAS, as well as the clock CLK, is generated by the sequencer 13, for example. The sense amplification section SA determines the read data out to the bit line BL, in accordance with the timing of asserting the control signal STB, for example.

The sense amplifier module 14 in the semiconductor device 1 according to the embodiment is not limited to the above-described circuit structure. For instance, the number of latch circuits included in a sense amplifier unit SAU may be suitably changed based on the number of pages stored in a cell unit CU. The sense amplification section SA may have any circuit structure other than the above, as long as it can determine the read data out to the bit line BL.

(Circuit Structure of Row Decoder Module 16)

FIG. 5 shows an exemplary circuit structure of the row decoder module 16 in the semiconductor device 1 according to the embodiment. As illustrated in FIG. 5, the row decoder module 16 may be connected to a driver module 15 by way of signal lines CG0 to CG7, SGDD0 to SGDD3, SGSD, USGD and USGS.

The circuit structure of a row decoder RD will be explained in detail below, focusing on the row decoder RD0, which corresponds to the block BLK0. A row decoder RD may include a block decoder BD, transfer gate lines TG and bTG, and transistors TR0 to TR17.

The block decoder BD decodes a block address BAd. Based on the decoding result, the block decoder BD applies a predetermined voltage to each of the transfer gate lines TG and bTG. The voltage applied to the transfer gate line TG and the voltage applied to the transfer gate line bTG exhibit a complementary relationship. In other words, an inverted signal to the signal for the transfer gate line TG is input to the transfer gate line bTG.

Each of the transistors TR0 to TR17 is an N-type MOS transistor having a high breakdown voltage. The gates of the transistors TR0 to TR12 are commonly connected to the transfer gate line TG. The gates of the transistors TR13 to TR17 are commonly connected to the transfer gate line bTG. Each transistor TR is arranged between and connected to the signal line from the driver module 15 and the corresponding wiring of the block BLK.

In particular, the drain of the transistor TR0 is connected to the signal line SGSD. The source of the transistor TR0 is connected to the select gate line SGS. The drains of the transistors TR1 to TR8 are connected to the signal lines CG0 to CG7, respectively. The sources of the transistors TR1 to TR8 are connected to the word lines WL0 to WL7, respectively. The drains of the transistors TR9 to TR12 are connected to the signal lines SGDD0 to SGDD3, respectively. The sources of the transistors TR9 to TR12 are connected to the select gate lines SGD0 to SGD3, respectively. The drain of the transistor TR13 is connected to the signal line USGS. The source of the transistor TR13 is connected to the select gate line SGS. The drains of the transistors TR14 to TR17 are commonly connected to the signal line USGD. The sources of the transistors TR14 to TR17 are connected to the select gate lines SGD0 to SGD3, respectively.

With the above structure, the row decoder module 16 can select a block BLK. In particular, during various operations, the block decoder BD corresponding to the selected block BLK applies an "H" level voltage and "L" level voltage to the transfer gate lines TG and bTG, respectively, and the block decoder BD corresponding to the non-selected block BLK applies an "L" level voltage and "H" level voltage to the transfer gate lines TG and bTG, respectively.

The circuit structure of the above row decoder module 16 is described as an example, and can be suitably changed. The number of transistors TR in the row decoder module 16 may be designed to correspond to the number of wirings provided in a block BLK.

[1-1-3] Structure of Memory Cell Array 10

An exemplary structure of the semiconductor device 1 according to the embodiment will be described below. In the drawings mentioned below, the X direction corresponds to the extending direction of the word lines WL, the Y direction corresponds to the extending direction of the bit lines BL, and the Z direction corresponds to the extending direction vertical to the surface of a semiconductor substrate, which is used for the formation of the semiconductor device 1. The plan views are provided with a hatch pattern, as appropriate, to enhance the visibility. This hatch pattern, however, may not relate to the materials or properties of the hatch-lined structural components. To enhance the visibility of the drawing, wirings, contacts and inter-layer insulating films may be omitted, as appropriate, from the cross-sectional view.

(Overall Structure of Semiconductor Device 1)

FIG. 6 shows an example of the overall structure of the semiconductor device 1 according to the embodiment. As illustrated in FIG. 6, the semiconductor device 1 includes a memory chip MC and a CMOS chip CC, with the top surface of the memory chip MC and the bottom surface of the CMOS chip CC adhered to each other. The memory chip MC may have a structure corresponding to the memory cell array 10. The CMOS chip CC may have components corresponding to the command register 11, address register 12, sequencer 13, sense amplifier module 14, driver module 15, and row decoder module 16.

The region of the memory chip MC may be divided into a memory region MR, hookup regions HR1 and HR2, and a pad region PR1. The memory region MR includes a plurality of NAND strings NS and is used for data storage. The memory region MR may be interposed between the hookup regions HR1 and HR2 in the X direction. The hookup regions HR1 and HR2 are used for connection between the memory cell array 10 in the memory chip MC and the row decoder module 16 in the CMOS chip CC. The pad region PR1 is arranged adjacent to the memory region MR and hookup regions HR1 and HR2 in the Y direction. An input/output circuit of the semiconductor device 1 may be arranged in the pad region PR1.

The region of the CMOS chip CC may be divided into a sense amplifier region SR, a peripheral circuit region PERI, transfer regions XR1 and XR2, and a pad region PR2. The sense amplifier region SR includes the sense amplifier module 14. The peripheral circuit region PERI may include the sequencer 13. The sense amplifier region SR and peripheral circuit region PERI are arranged adjacent to each other in the Y direction. The sense amplifier region SR and peripheral circuit region PERI, together, are superposed on the memory region MR of the memory chip MC, and are interposed between the transfer regions XR1 and XR2 in the X direction. The transfer regions XR1 and XR2 may include the row decoder module 16. The transfer regions XR1 and XR2 are superposed on the hookup regions HR1 and HR2, respectively, of the memory chip MC. The pad region PR2 is superposed on the pad region PR1 of the memory chip MC. An input/output circuit of the semiconductor device 1 may be provided in the pad region PR2.

The memory chip MC includes a plurality of bonding pads BP on top of the memory region MR, hookup regions HR1 and HR2, and pad region PR1. The CMOS chip CC includes a plurality of bonding pads BP on the bottom of the sense amplifier region SR, peripheral circuit region PERI, transfer regions XR1 and XR2, and pad region PR2.

The bonding pads BP of the memory region MR may be electrically connected to the bit line BL, and superposed on the bonding pads BP of the sense amplifier region SR. The bonding pads BP of the hookup region HR1 may be electrically connected to the word lines WL, and superposed on the bonding pads BP of the transfer region XR1. The bonding pads BP of the hookup region HR2 may be electrically connected to the word lines WL, and superposed on the bonding pads BP of the transfer region XR2. The bonding pads BP of the pad region PR1 are superposed on the bonding pads BP of the pad region PR2. In each region, the facing bonding pads BP of the memory chip MC and CMOS chip CC are bonded and electrically connected to each other.

A plurality of pads are provided on top of the CMOS chip CC, although they are not illustrated in the drawings. These pads are used for establishing a connection between the semiconductor device 1 and an external device such as the memory controller 2. The above-explained structure is not a limitation to the overall structure of the semiconductor device 1 according to the embodiment. For example, the structure may include at least one hookup region HR adjacent to the memory region MR. The semiconductor device 1 may include a plurality of sets of the memory region MR and the hookup regions HR. If this is the case, the sets of the sense amplifier region SR, transfer regions XR and peripheral circuit region PERI are suitably provided to correspond to the arrangement of the memory region MR and hookup regions HR. The pad regions PR1 and PR2 may be omitted. If this is the case, the input/output circuit of the semiconductor device 1 is provided in the peripheral circuit region PERI of the CMOS chip CC.

(Structure of Memory Chip MC)

Figure 7:
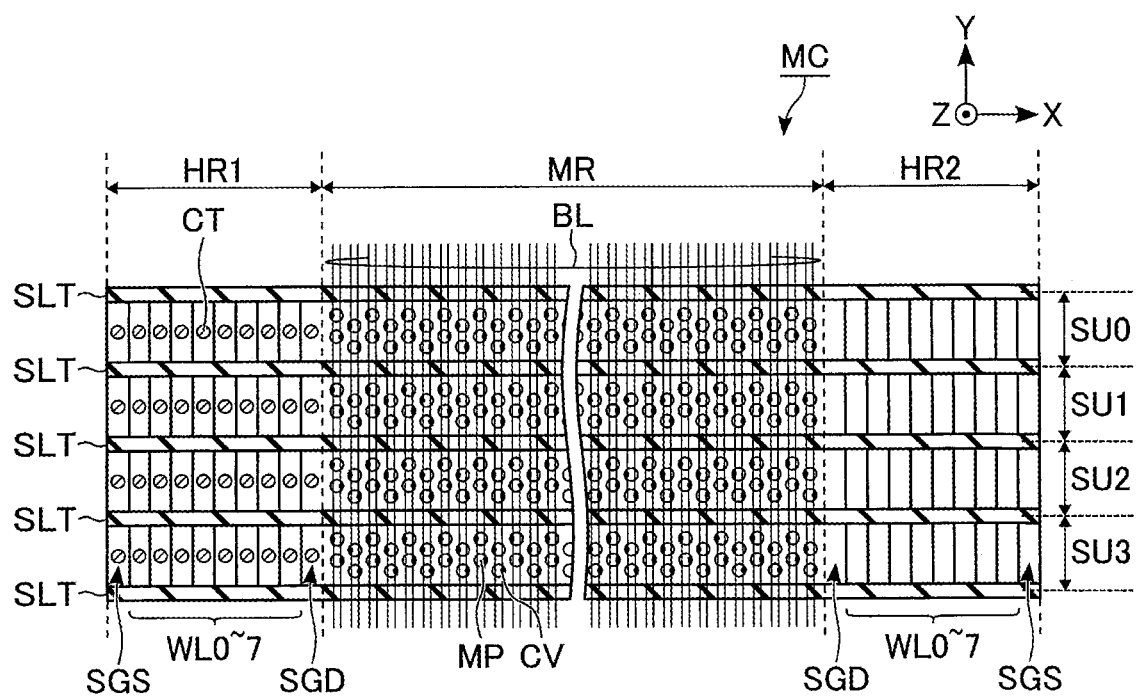
FIG. 7 is a plan view of an exemplary planar layout of a memory chip in the semiconductor device according to the embodiment.

FIG. 7 is an exemplary planar layout of a memory chip MC in the semiconductor device 1 according to the embodiment, illustrating an area corresponding to one block BLK (i.e., string units SU0 to SU3) in the memory region MR and hookup regions HR1 and HR2. As illustrated in FIG. 7, a memory chip MC includes a plurality of slits SLT, a plurality of memory pillars MP, a plurality of bit lines BL, and a plurality of contacts CT and CV.

The slits SLT extend in the X direction, across the memory region MR and hookup regions HR1 and HR2 in the X direction. The slits SLT are aligned in the Y direction. A slit SLT divides any two conductive layers arranged in the same interconnect layer and adjacent to each other with the slit SLT interposed between. In particular, the slit SLT divides a plurality of interconnect layers respectively corresponding to the word lines WL0 to WL7 and select gate lines SGD and SGS.

The memory pillars MP each function as a NAND string NS. The memory pillars MP may be arranged in four rows in a staggered manner in an area between two adjacent slits SLT in the memory region MR. The number and arrangement of the memory pillars MP between two adjacent slits SLT are not limited to this example, but may be suitably changed.

At least part of the bit lines BL extend in the Y direction, and are aligned in the X direction. Each bit line BL is arranged so as to overlap at least one memory pillar MP in each string unit SU. In the present example, two bit lines BL overlap each memory pillar MP. A contact CV is provided between a memory pillar MP and one of the bit lines BL that overlaps the memory pillar MP. Each of the memory pillars MP is electrically connected to the corresponding bit line BL via the contact CV.

In the hookup regions HR1 and HR2, the select gate line SGS, word lines WL0 to WL7, and select gate line SGD each include a portion (terraced portion) that is not covered by the upper interconnect layer (conductive layer). The portions uncovered by the upper wiring layers in the hookup regions HR1 and HR2 resemble steps, a terrace, or rimstone. In particular, steps are created between the select gate line SGS and word line WL0, between the word lines WL0 and WL1, . . . , between the word lines WL6 and WL7, and between the word lines WL7 and select gate line SGD.

The contacts CT are used for establishing a connection between the row decoder module 16 and the word lines WL0 to WL7 or select gate lines SGS and SGD that are connected to the NAND string NS. In the illustrated area, a contact CT is provided in the terraced portion of each of the word lines WL0 to WL7 and select gate lines SGS and SGD in the hookup region HR1. At least one contact CT should be arranged in the terraced portion of each of the word lines WL0 to WL7 and select gate lines SGD and SGS in the area between two adjacent slits SLT.

In the planar layout of the memory cell array 10 according to the above embodiment, each of the regions partitioned by the slits SLT corresponds to a single string unit SU. That is, the string units SU0 to SU3 extending in the X direction are aligned in the Y direction. In the memory region MR and hookup regions HR1 and HR2, the layout of FIG. 7 repeats in the Y direction.

In the example of FIG. 7, the string units SU corresponding to the same block BLK are separated by the slits SLT. The word lines WL and the select gate line SGS are electrically connected respectively to the word lines WL and the select gate line SGS of the same block BLK and arranged in the same interconnect layer, by way of a different interconnect layer. However, this is not a limitation, and the slits SLT interposed between the slits SLT corresponding to the boundaries of a block BLK should separate at least the select gate line SGD. If this is the case, the word lines WL arranged in the same interconnect layer of the same block BLK are sequentially provided and electrically connected to each other in the hookup regions HR1 and HR2.

Figure 8:
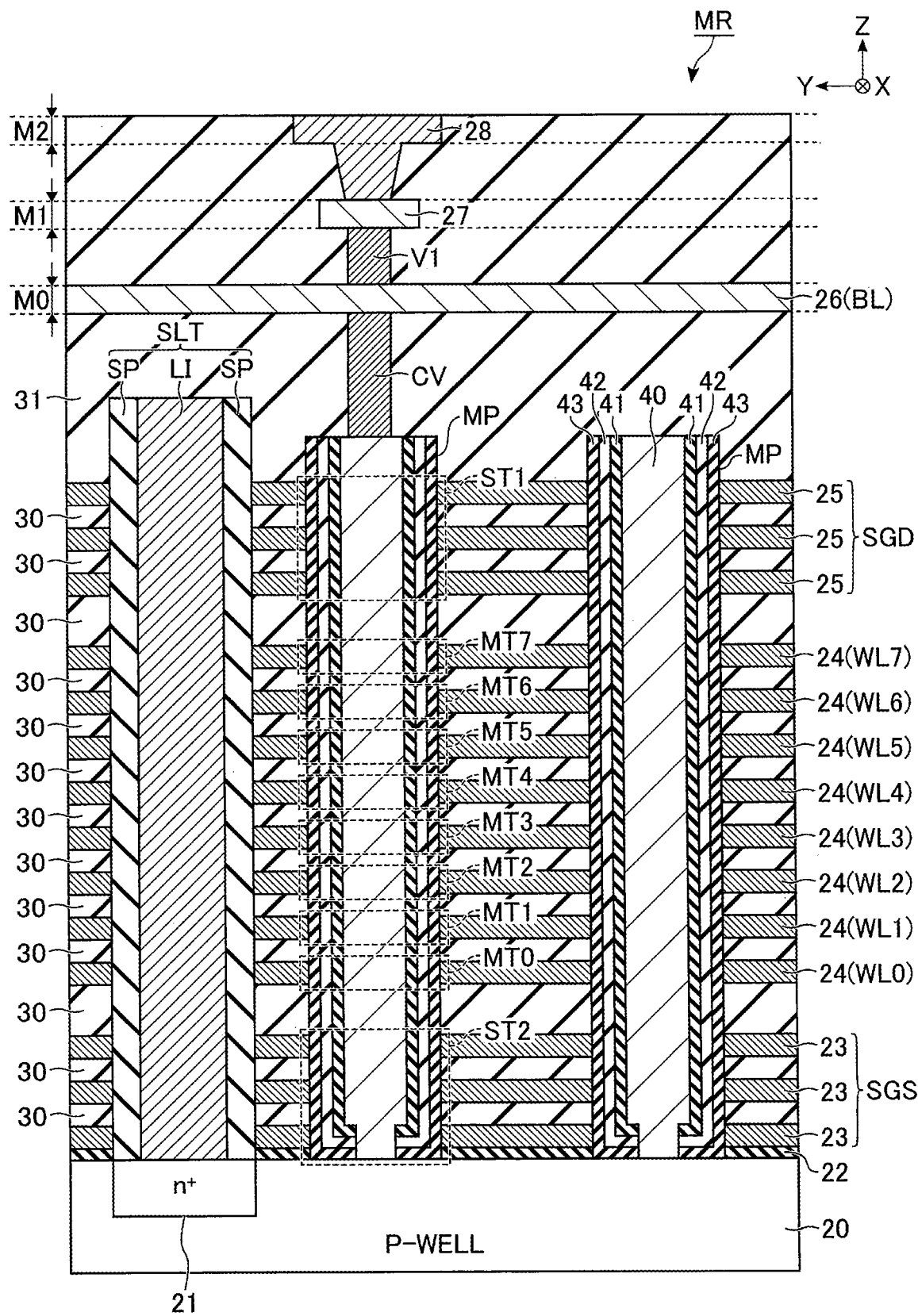
FIG. 8 is a cross-sectional view of an exemplary cross-section of a memory region in the semiconductor device according to the embodiment.

FIG. 8 shows an exemplary cross-sectional structure of the memory region MR of the memory cell array 10 in the semiconductor device 1 according to the embodiment, illustrating a cross section of the structure in the Y direction, including the memory pillar MP of FIG. 7. As illustrated in FIG. 8, the memory cell array 10 includes a P-type well region 20, an insulating layer 22, conductive layers 23 to 27, and a joint metal 28.

The P-type well region 20 is arranged in the vicinity of the surface of the semiconductor substrate, and includes an N-type semiconductor region 21. The N-type semiconductor region 21 serves as an N-type impurity diffusion region arranged in the vicinity of the surface of the P-type well region 20. The N-type semiconductor region 21 may be doped with phosphorus.

The insulating layer 22 is provided on the P-type well region 20. The conductive layers 23 and insulating layers 30 are alternately stacked on the insulating layer 22. Each of the conductive layers 23 may be formed into a plate expanding along the XY plane. The stacked conductive layers 23 are used as a select gate line SGS. The conductive layers 23 may contain tungsten.

The insulating layers 30 and conductive layers 24 are alternately stacked above the topmost conductive layer 23. A conductive layer 24 may be formed into a plate expanding along the XY plane. The stacked conductive layers 24 are employed as word lines WL0 to WL7 in ascending order from the side of the P-type well region 20. The conductive layers 24 may contain tungsten.

The insulating layers 30 and conductive layers 25 are alternately stacked above the topmost conductive layer 24. A conductive layer 25 may be formed into a plate expanding along the XY plane. The stacked conductive layers 25 are used as select gate line SGD. The conductive layers 25 may contain tungsten.

A conductive layer 26 is provided above the topmost conductive layer 25 with the insulating layer 31 interposed between. The conductive layer 26 may be formed into a line extending in the Y direction, and is used as a bit line BL. That is, a plurality of conductive layers 26 are aligned along the X direction in an area that is not shown in the drawing. The conductive layer 26 may contain copper.

Each of the memory pillars MP extends in the Z direction, penetrating the insulating layer 22, conductive layers 23 to 25, and insulating layers 30. The bottom of the memory pillar MP is in contact with the P-type well region 20. Furthermore, each of the memory pillars MP may include a semiconductor layer 40, a tunnel insulating film 41, an insulating film 42, and a block insulating film 43.

The semiconductor layer 40 extends along the Z direction. The top end of the semiconductor layer 40 is included in a layer above the topmost conductive layers 25, while the bottom end of the semiconductor layer 40 is in contact with the P-type well region 20. The tunnel insulating film 41 covers the peripheral surface of the semiconductor layer 40. The insulating film 42 covers the peripheral surface of the tunnel insulating film 41. The block insulating film 43 covers the peripheral surface of the insulating film 42. The tunnel insulating film 41 and block insulating film 43 may each contain silicon oxide ($SiO_2$). The insulating film 42 may contain silicon nitride (SiN). Each of the memory pillars MP may further include an insulating layer inside semiconductor layer 40 so that this insulating layer is arranged at the center of the memory pillar MP.

In the above described structure of the memory pillar MP, the intersecting portion of a memory pillar MP and conductive layers 23 functions as a selection transistor ST2. The intersecting portions of the memory pillar MP and the conductive layers 24 function as memory cell transistors MT. The intersecting portion of the memory pillar MP and the conductive layers 25 functions as a select transistor ST1. The semiconductor layer 40 is used as a channel for the memory cell transistors MT0 to MT7 and selection transistors ST1 and ST2. The insulating film 42 functions as a charge storage layer of the memory cell transistors MT.

Pillar-shaped contacts CV are provided on the semiconductor layers 40 of the memory pillars MP. In the illustrated area, one of the two memory pillars MP has a contact CV connected thereon. For the memory pillar MP having no contact CV in this area, a contact CV is connected thereon in a not-shown area.

A conductive layer 26, or in other words a bit line BL, is in contact with the top surface of the contact CV. One contact CV is connected to a conductive layer 26 (bit line BL) in each space partitioned by the slits SLT. That is, a memory pillar MP arranged between two adjacent slits SLT is electrically connected to each of the conductive layers 26.

A pillar-shaped contact V1 is provided on the conductive layer 26. On this contact V1, a conductive layer 27 is provided. The conductive layer 27 is a wiring that is used for forming a connection between the circuits of the semiconductor device 1. A joint metal 28 is provided on the conductive layer 27. The joint metal 28 is in contact with the interface to the memory chip MC, and is used as a bonding pad BP. The joint metal 28 may contain copper. Hereinafter, the two interconnect layers in which the conductive layers 26 and 27 are provided are referred to as interconnect layers M0 and M1, and the interconnect layer from which the joint metal 28 is exposed and which is in contact with the interface to the memory chip MC is referred to as an interconnect layer M2.

At least part of the slit SLT is shaped into a plate expanding along the XZ plane, to partition the insulating layer 22, conductive layers 23 to 25, and insulating layers 30. The top end of the slit SLT is included in the layer between the topmost conductive layer 25 and the conductive layer 26. The bottom end of the slit SLT is in contact with the N-type semiconductor region 21 of the P-type well region 20. The slit SLT may include a contact LI and a spacer SP.

At least part of the contact LI is shaped into a plate expanding along the XZ plane. The bottom of the contact LI is electrically connected to the N-type semiconductor region 21. The contact LI is used as a source line SL. The contact LI may be semi-conductive or metallic. The spacer SP covers the peripheral surface of the contact LI. The contact LI is separated by the spacer SP from each of the conductive layers 23 to 25 and insulating layers 30. That is, the spacer SP insulates between the contact LI and the interconnect layers adjacent to the slit SLT. As a spacer SP, insulators such as silicon oxide ($SiO_2$) and silicon nitride (SiN) are adopted.

Figure 9:
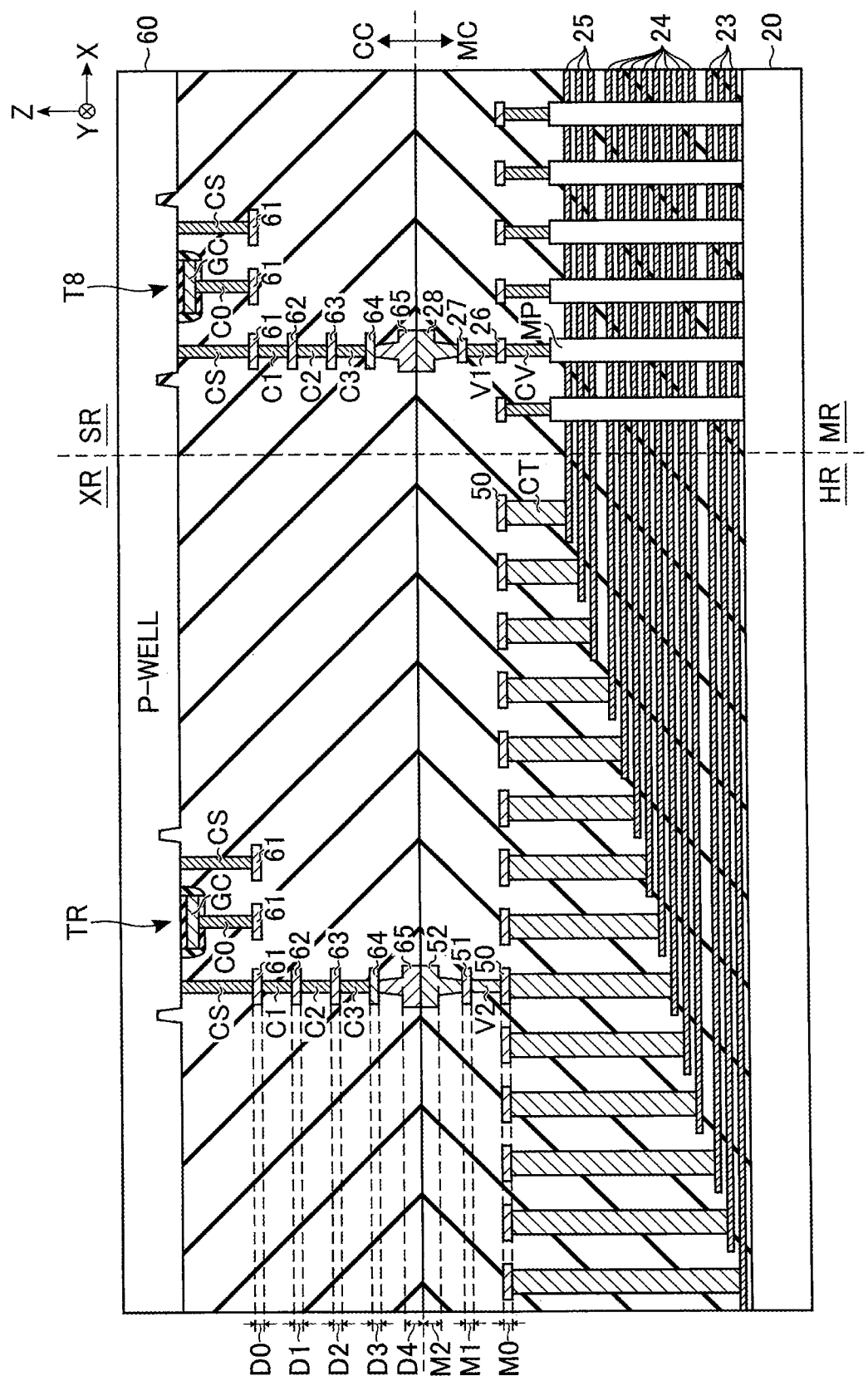
FIG. 9 is a cross-sectional view of an exemplary cross-section of a memory region, a hookup region, a sense amplifier region, and a transfer region in the semiconductor device according to the embodiment.

FIG. 9 shows an exemplary cross-sectional structure of the semiconductor device 1 according to the embodiment, including the memory region MR, hookup region HR, sense amplifier region SR, and transfer region XR. The structure of the hookup regions HR in the memory chip MC will be explained with reference to FIG. 9.

In the hookup region HR, the select gate line SGS, word lines WL0 to WL7, and select gate line SGD are configured into a stepped structure having steps in the X direction, as illustrated in FIG. 9. Furthermore, in the hookup region HR, the semiconductor device 1 includes a plurality of contacts CT and V2, a plurality of conductive layers 50 and 51, and a plurality of joint metals 52.

The contacts CT are respectively provided on the terraced portions of the conductive layers 23, which correspond to the select gate line SGS, the conductive layers 24, which respectively correspond to word lines WL0 to WL7, and the conductive layers 25, which correspond to the select gate line SGD.

A conductive layer 50 is provided on each contact CT. A pillar-shaped contact V2 is provided on the conductive layer 50. A conductive layer 51 is provided on the contact V2. A joint metal 52 is provided on the conductive layer 51. The conductive layers 50 and 51 are included in the interconnect layers M0 and M1, respectively. The joint metal 52 is included in the interconnect layer M2. The joint metal 52 is in contact with the interface to the memory chip MC, and is used as a bonding pad BP. The joint metal 52 may contain copper.

FIG. 9 shows only a set of the contact V2, conductive layer 51 and joint metal 52 corresponding to the word line WL2. In the not-shown area, however, sets of the contact V2, conductive layer 51 and joint metal 52 are respectively connected to their conductive layers 50.

(Structure of CMOS Chip CC)

FIG. 9 will still be referred to for the following explanation of the structure of the CMOS chip CC. The structure of the transistor T8 in the sense amplifier region SR and the structure of the transistor TR in the transfer regions XR are presented in FIG. 9. As illustrated in FIG. 9, the CMOS chip CC may include a P-type well region 60, conductive layers GC and 61 to 64, pillar-shaped contacts CS and C0 to C3, and joint metals 65.

The P-type well region 60 contains P-type impurities, and is included in the semiconductor substrate used for the formation of the CMOS chip CC. FIG. 9 illustrates an example of the P-type well region 60 continuously arranged between the sense amplifier region SR and transfer region XR. However, the P-type well region 60 of the sense amplifier region SR and the P-type well region 60 of the transfer region XR may be isolated from each other through shallow trench isolation (STI).

In the sense amplifier region SR, at least two contacts CS are provided beneath the P-type well region 60, and also a conductive layer GC is provided beneath the P-type well region 60 with a gate insulating film interposed between. The conductive layer GC may be used as a gate electrode of the transistor T8. A contact C0 is provided beneath the conductive layer GC. The bottom surfaces of the contacts CS and C0 are aligned.

A conductive layer 61 is provided beneath each of the contacts CS and C0. Beneath the conductive layer 61 a contact C1 is provided. Beneath the contact C1 a conductive layer 62 is provided. Beneath the conductive layer 62 a contact C2 is provided. Beneath the contact C2 a conductive layer 63 is provided. Beneath the conductive layer 63 a contact C3 is provided. Beneath the contact C3 a conductive layer 64 is provided. Beneath the conductive layer 64 a joint metal 65 is provided. The joint metal 65 may contain copper. Hereinafter, the interconnect layers in which the conductive layers 61, 62, 63 and 64 are provided are referred to as interconnect layers D0, D1, D2 and D3, respectively, and the interconnect layer from which the joint metal 65 is exposed and which is in contact with the interface to the CMOS chip CC is referred to as an interconnect layer D4.

The joint metals 65 are used as bonding pads BP, and arranged at the very bottom of the sense amplifier region SR. The joint metals 65 of the sense amplifier region SR are electrically connected to the corresponding joint metals 28 of the memory region MR. That is, the joint metals 65 of the sense amplifier region SR are bonded to the corresponding joint metals 28 of the memory region MR.

The structure of the transistor TR in the transfer region XR may be the same as that of the transistor T8 in the sense amplifier region SR. The joint metals 65 in the transfer region XR are used as bonding pads BP, and are arranged at the very bottom of the transfer region XR. The joint metals 65 in the transfer region XR are electrically connected to the corresponding joint metals 52 in the hookup region HR. That is, the joint metals 65 in the transfer region XR are bonded to the corresponding joint metals 52 in the hookup region HR.

FIG. 10 shows an exemplary cross-sectional structure of a pad region PR in the semiconductor device 1 according to the embodiment. In FIG. 10, the structure of a high breakdown voltage transistor HV provided in the pad region PR and the structure of the pads connected to the wirings of the CMOS chip CC penetrating the P-type well region 60 are shown. In the pad region PR, the semiconductor device 1 may include N-type semiconductor regions NP, an N-type well region DN, a plurality of contacts CP, insulating layers 70, 71 and 73 to 75, a conductive layer 72, and pads PD1 and PD2, as illustrated in FIG. 10.

The structure of the transistor HV may be the same as that of the transistor TR. The N-type semiconductor regions NP are provided in the area of the P-type well region 60 where the contact CS is in contact with the P-type well region 60. The N-type well region DN is provided in the area of the P-type well region 60 that faces the region between two adjacent N-type semiconductor regions NP corresponding to the common transistor HV. In other words, the N-type well region DN is arranged above the gate electrode (conductive layer GC) of the transistor HV.

The N-type well region DN may be arranged so as not to partially encircle the P-type well region 60 in which the corresponding transistor HV is provided. Preferably, the N-type well region DN is not brought into contact with the top surface or bottom surface of the P-type well region 60. The N-type well region DN will suffice as long as it is separated at least from the N-type semiconductor regions NP and overlaps the conductive layer GC in planar view. The N-type well region DN contains N-type impurities. As the N-type impurities used in the N-type well region DN, phosphorus or arsenic may be adopted.

A contact CP may be provided to penetrate the interconnect layer D0 and to be in contact with the layer that includes the bottom surface of the P-type well region 60. The contact CP is electrically connected to the circuits of the CMOS chip CC via other interconnect layers D1 to D3. Alternatively, the contact CP may be electrically connected to the circuits of the memory chip MC via the bonding pads BP of the CMOS chip CC.

The insulating layers 70 and 71, conductive layer 72, and insulating layers 73 to 75 are deposited in this order on the P-type well region 60. The conductive layer 72 is electrically connected to the N-type well region DN and to the contact CP. The portion of the conductive layer 72 connected to the N-type well region DN and the portion of the conductive layer 72 connected to the contact CP extend through part of the insulating layer 70 and the P-type well region 60. Furthermore, the conductive layer 72 connected to the N-type well region DN and the conductive layer 72 connected to the contact CP are separated from each other by a dividing portion DIV.

The conductive layer 72 connected to the N-type well region DN should be in contact at least with the N-type well region DN, and may be provided to penetrate the N-type well region DN. A pad PD1 is provided on the conductive layer 72 connected to the N-type well region DN, and a pad PD2 is provided on the conductive layer 72 connected to the contact CP. The pads PD1 and PD2 are both exposed on the top surface of the semiconductor device 1, and are connected to the memory controller 2. Part of the pad PD1 and part of the pad PD2 penetrate the insulating layers 73 to 75.

The insulating layers 70, 71 and 73 may be formed of silicon oxide. The insulating layer 74 may be formed of silicon nitride. The insulating layers 73 to 75 may be omitted as long as the structure can be sufficiently protected. The pads PD1 and PD2 may be formed of a metal such as aluminum. The pads PD1 and PD2 may be connected directly to the N-type well region DN and the contact CP, without the conductive layer 72 interposed between.

[1-2] Manufacturing Method of Semiconductor Device

Figure 11:
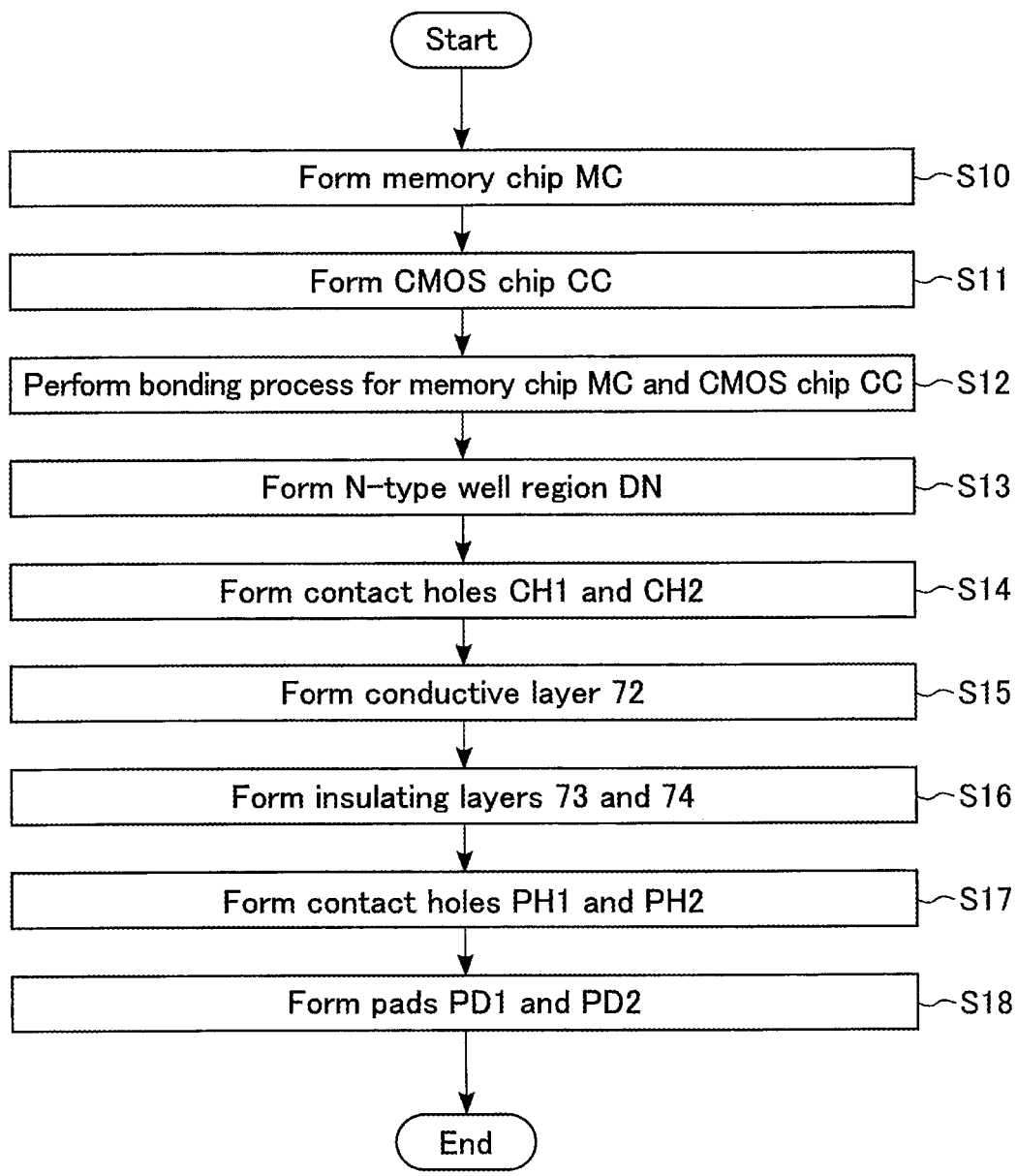
FIG. 11 is a flowchart of a method of manufacturing the semiconductor device according to the embodiment.

By referring to FIG. 11, an exemplary method of manufacturing the semiconductor device 1 according to the embodiment will be explained below. FIG. 11 is a flowchart of the exemplary method of manufacturing the semiconductor device according to the embodiment. FIGS. 12 to 21 show the cross-sectional structure of the semiconductor device 1 according to the embodiment in different steps of the manufacturing process, focusing on the same area as in FIG. 10.

First, a memory chip MC is formed (step S10), and then a CMOS chip CC is formed (step S11). The memory chip MC and CMOS chip CC are formed by using different semiconductor substrates, and therefore the step of forming the memory chip MC and the step of forming the CMOS chip CC may be conducted in parallel.

Next, through the bonding process, the memory chip MC and CMOS chip CC are bonded to each other, as illustrated in FIG. 12 (step S12). In brief, the memory chip MC and CMOS chip CC are arranged in the not-illustrated area so that the bonding pads BP exposed on the memory chip MC and the bonding pads BP exposed on the CMOS chip CC face each other; through the thermal process, the bonding pads BP that face each other are bonded to each other; and through chemical mechanical polishing (CMP) or the like, the substrate of the CMOS chip CC (e.g., P-type well region 60) is thinned down.

Figure 13:
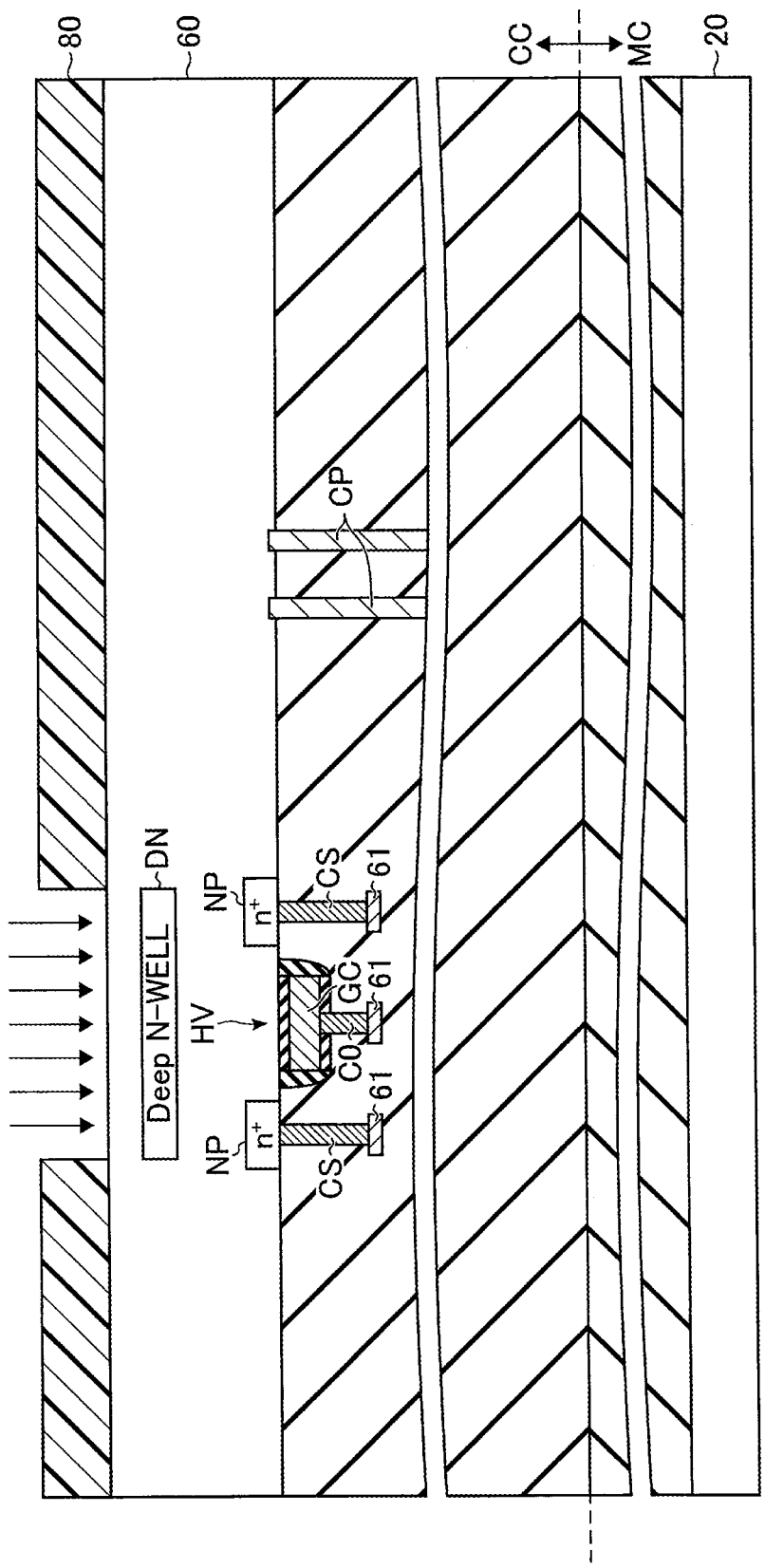

Next, as illustrated in FIG. 13, an N-type well region DN is formed (step S13). In particular, first, a mask with an opening in the area corresponding to the N-type well region DN is formed through photolithography or the like. Thereafter, through the ion implantation process using the mask and the subsequent thermal process, an N-type well region DN is formed above the transistor HV. The mask used in this process is removed after the ion implantation process.

Figure 14:
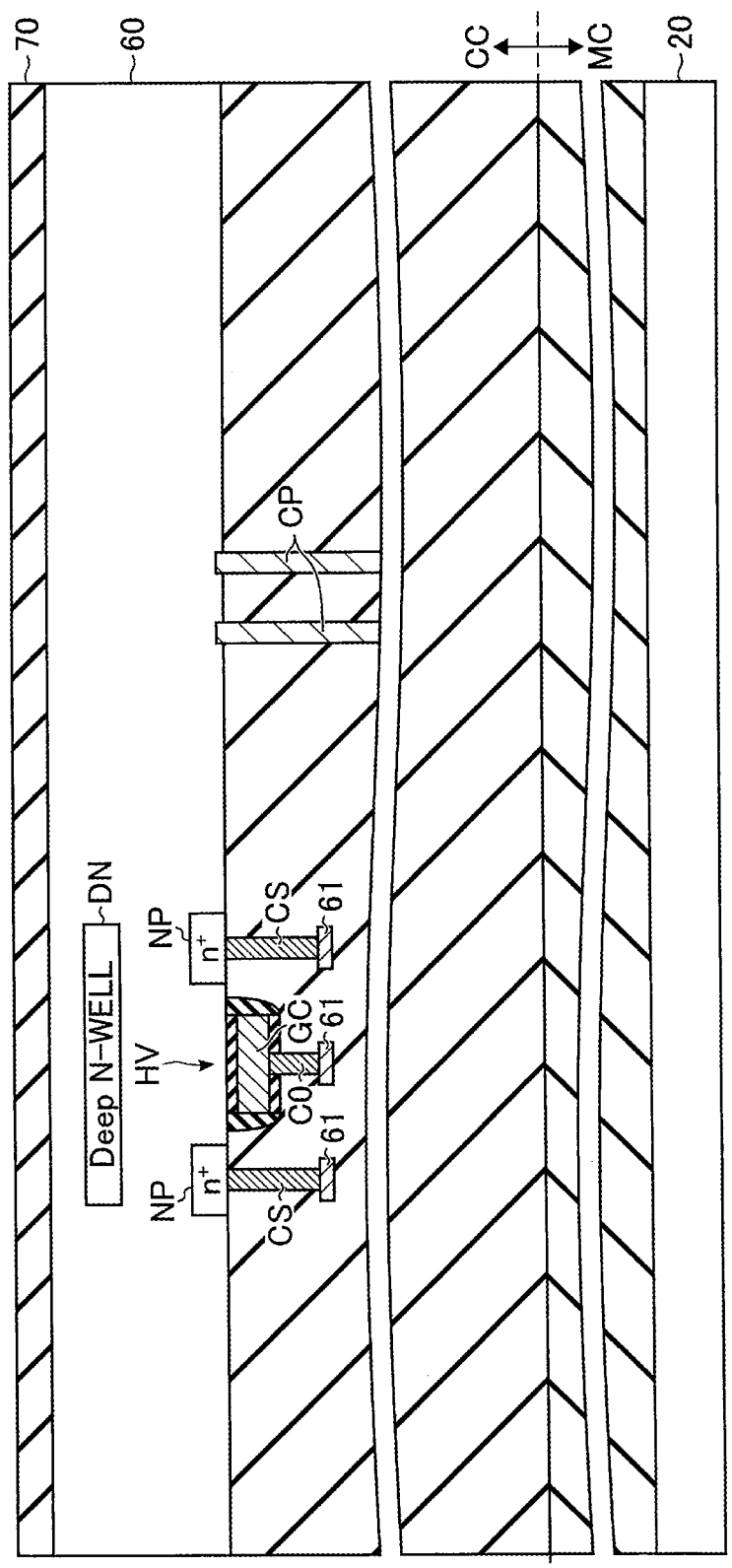

Next, contact holes CH1 and CH2 are formed (step S14). In particular, first, an insulating layer 70 is formed on the P-type well region 60, as illustrated in FIG. 14. Through the photolithography or the like, a mask 81 is formed with an opening in the area corresponding to the N-type well region DN. Then, through anisotropic etching using this mask 81, a contact hole CH1 is formed as illustrated in FIG. 15. In this process, the N-type well region DN should be exposed at least at the bottom of the contact hole CH1. After the formation of the contact hole CH1, the mask 81 is removed.

Thereafter, a mask 82 is formed through the photolithography or the like, with an opening in the area corresponding to the contacts CP. Then, through anisotropic etching using this mask 82, a contact hole CH2 is formed as illustrated in FIG. 16. In this process, part of the contacts CP should be exposed at least at the bottom of the contact hole CH2. After the formation of the contact hole CH2, the mask 82 is removed.

Figure 17:
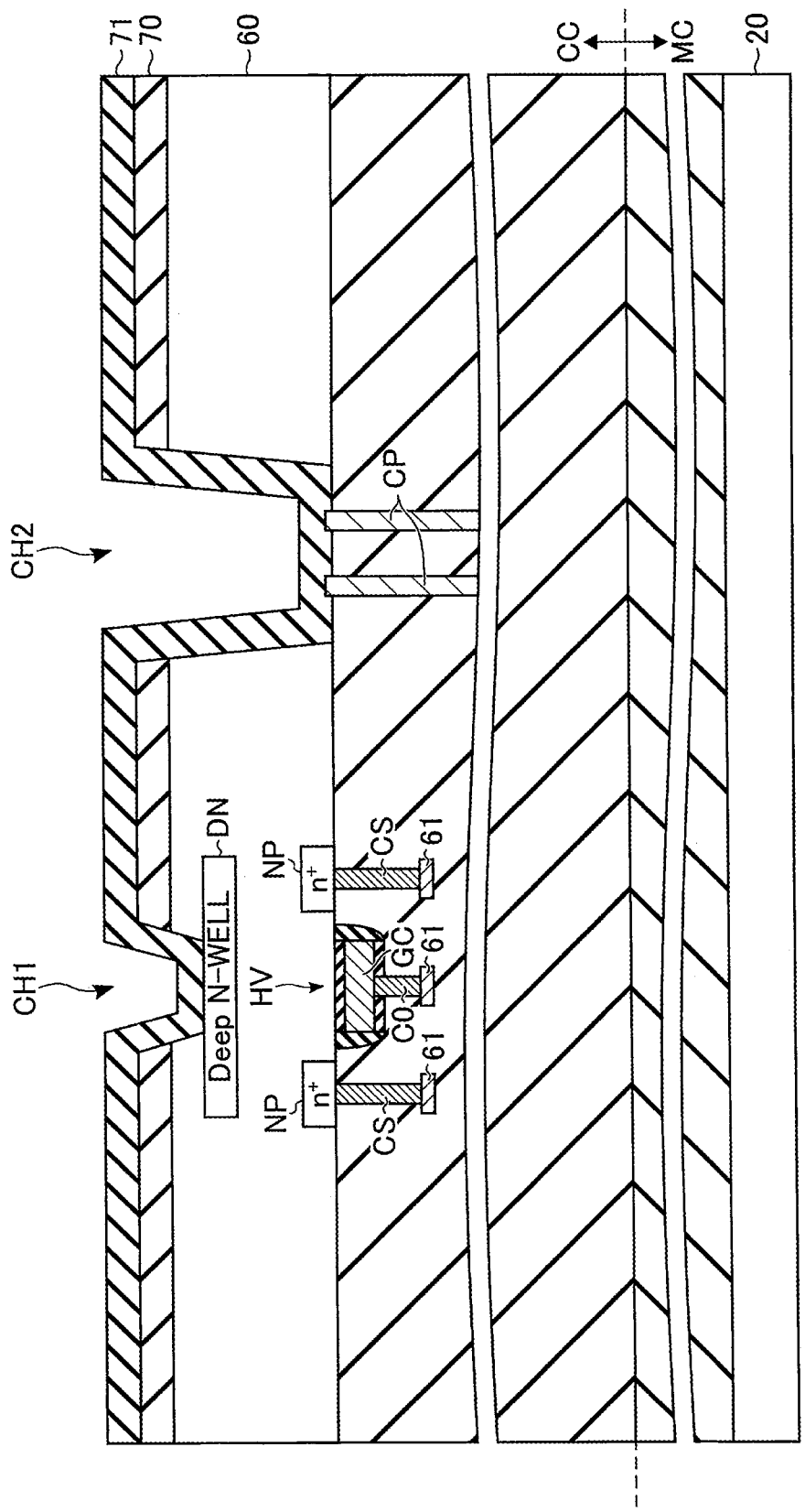
Figure 18:
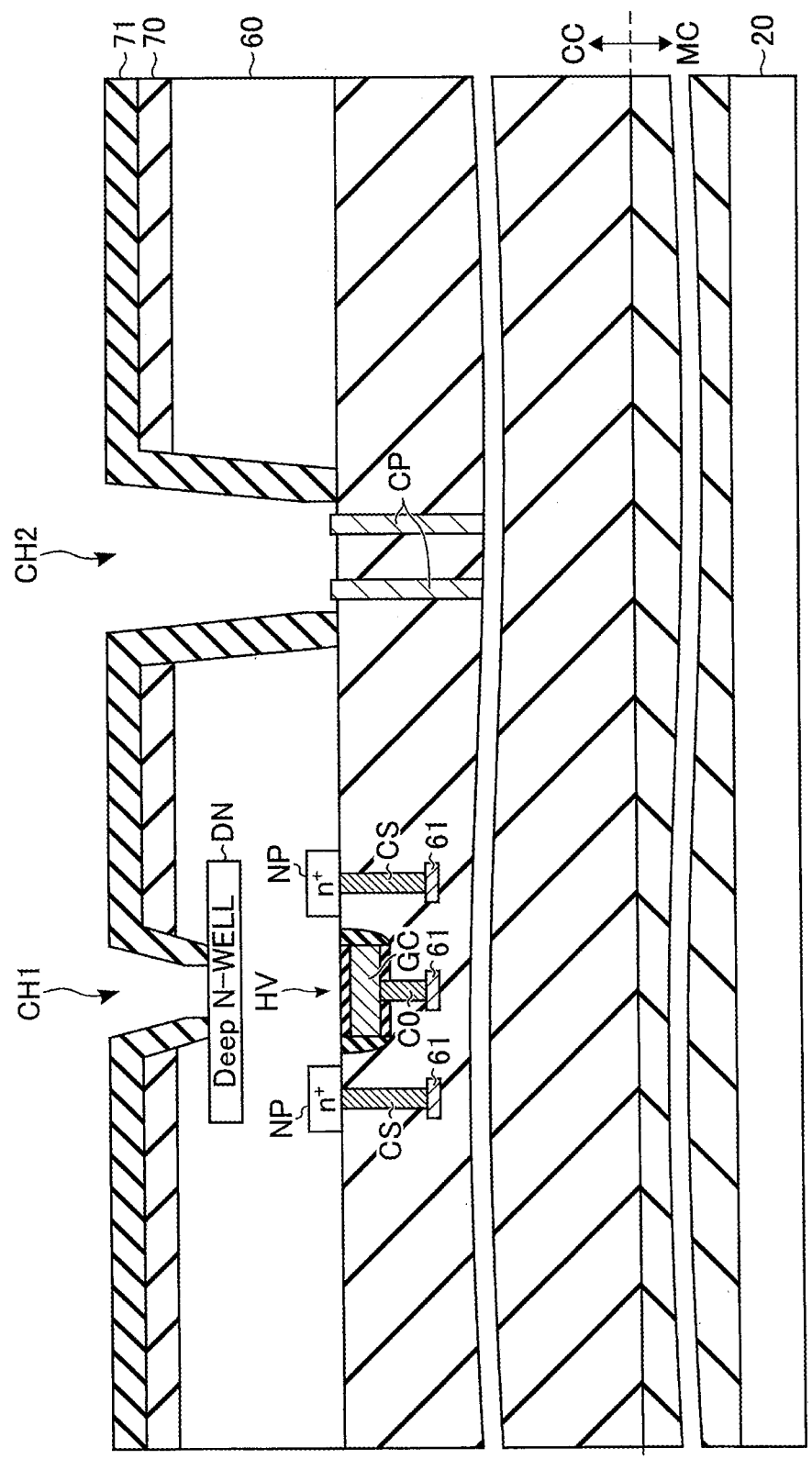

Next, a conductive layer 72 is formed (step S15). In particular, an insulating layer 71 is first formed on the insulating layer 70, as illustrated in FIG. 17. This insulating layer 71 is formed also on the side surfaces of the contact holes CH1 and CH2. Subsequently, through the anisotropic etching, part of the insulating layer 71 provided on the bottoms of the contact holes CH1 and CH2 is removed, as illustrated in FIG. 18. By this etching for removing the insulating layer 71 from the bottoms of the contact holes CH1 and CH2, the insulating layer 71 may also be removed from the top of the insulating layer 70.

Figure 19:
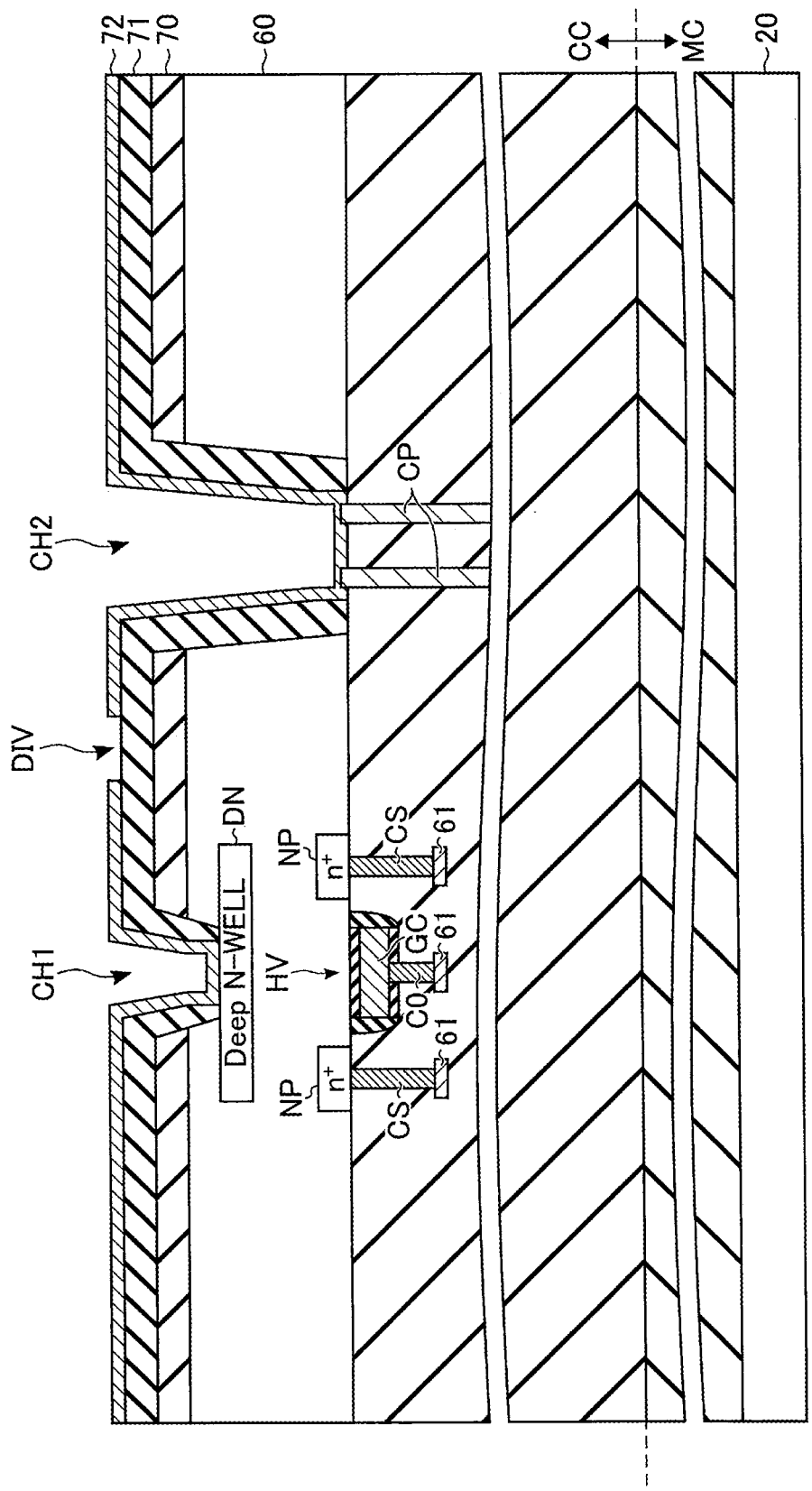

In this manner, the N-type well region DN is exposed at the bottom of the contact hole CH1, and part of the contact CP is exposed at the bottom of the contact hole CH2. Thereafter, a conductive layer 72 is formed on the insulating layer 71 and the exposed portions in the contact holes CH1 and CH2. Then, through processing using photolithography and etching, a dividing portion DIV is formed, as illustrated in FIG. 19. The conductive layer 72 is thereby formed into a desired pattern, and is divided for each interconnect layer.

Next, insulating layers 73 and 74 are formed, as illustrated in FIG. 20 (step S16). In this process, the contact holes CH1 and CH2 may be filled in by these insulating layers 73 and 74. As the insulating layer 73, silicon oxide may be used. As the insulating layer 74, silicon nitride may be used.

Figure 21:
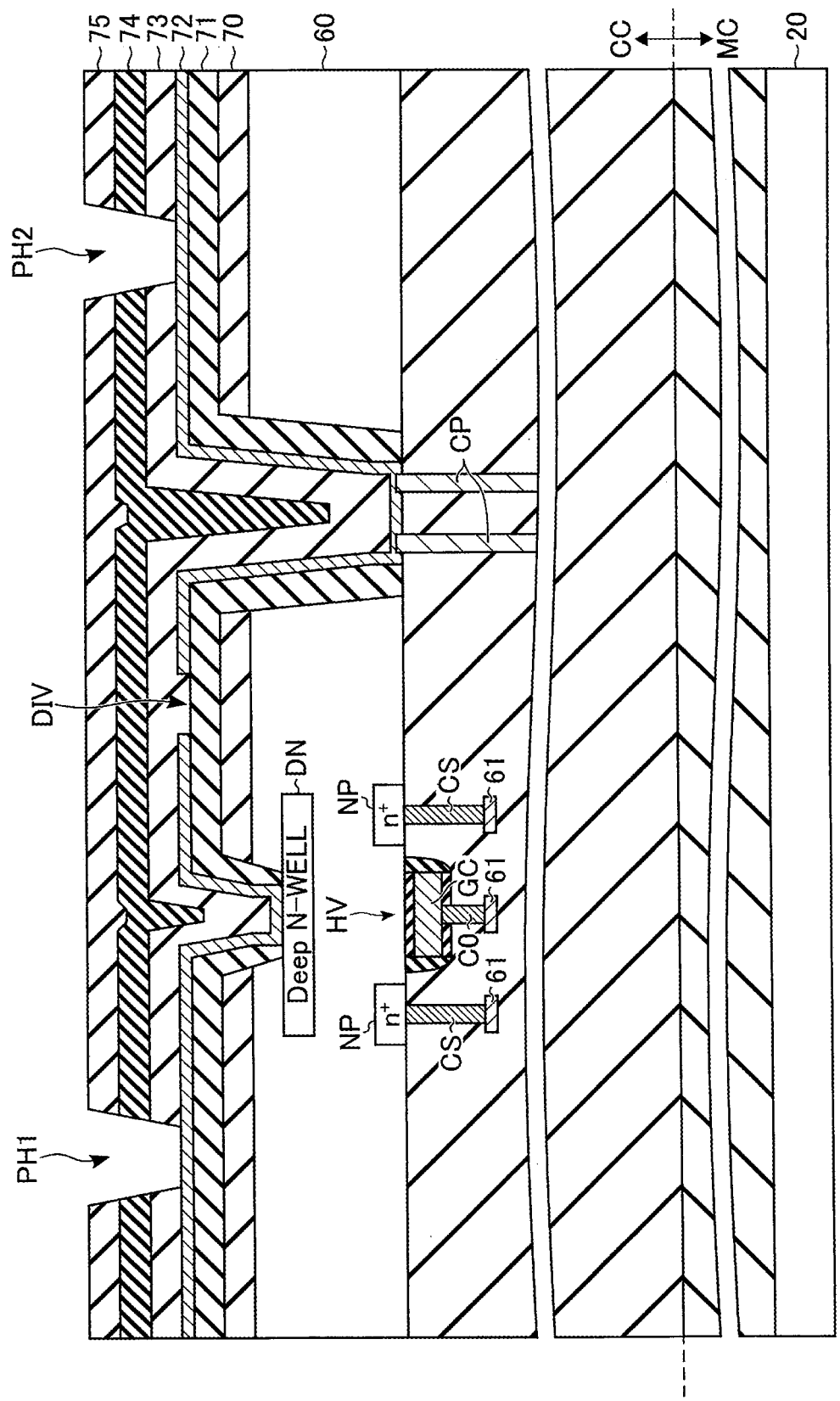

Next, contact holes PH1 and PH2 are formed, as illustrated in FIG. 21 (step S17). In particular, an insulating layer 75 is first formed on the insulating layer 74. As the insulating layer 75, polyimide may be used. Thereafter, a mask is formed through photolithography or the like, with openings in the areas corresponding to the conductive layers 72 respectively connected to contact holes CH1 and CH2. Subsequently, through the anisotropic etching using this mask, contact holes PH1 and PH2 are formed. In this process, at least part of the conductive layer 72 should be exposed at the bottoms of the contact holes PH1 and PH2. After the formation of the contact holes PH1 and PH2, this mask is removed.

Next, pads PD1 and PD2 are formed (step S18). In particular, a conductive layer is first formed to fill the contact holes PH1 and PH2. Thereafter, through the process using photolithography and etching, this conductive layer is divided into respective pads PD. In this manner, the structure of the semiconductor device 1 as explained with reference to FIG. 10 is completed.

The above manufacturing method of the semiconductor device 1 according to the embodiment is explained merely as an example. Some other process may be inserted between the manufacturing processes, or the processes may be interchanged as long as it does not incur any problem. The formation of an N-type well region DN may be performed at the time of forming a CMOS chip CC. If this is the case, the formation of the N-type well region DN through the ion implantation process is performed before forming the transistor structure of the CMOS chip CC.

[1-3] Operation of Semiconductor Device

An exemplary erase operation of the semiconductor device 1 according to the embodiment will be described below. The voltages applied to the interconnect layers may be referred to with reference numerals only where appropriate. A block BLK targeted for the erase operation will be referred to as a selected block BLK, and a block BLK that is not targeted for the erase operation will be referred to as a non-selected block BLK. The voltages to be applied to the interconnect layers and nodes may be generated by the driver module 15, and applied via the row decoder module 16 or the like.

Figure 22:
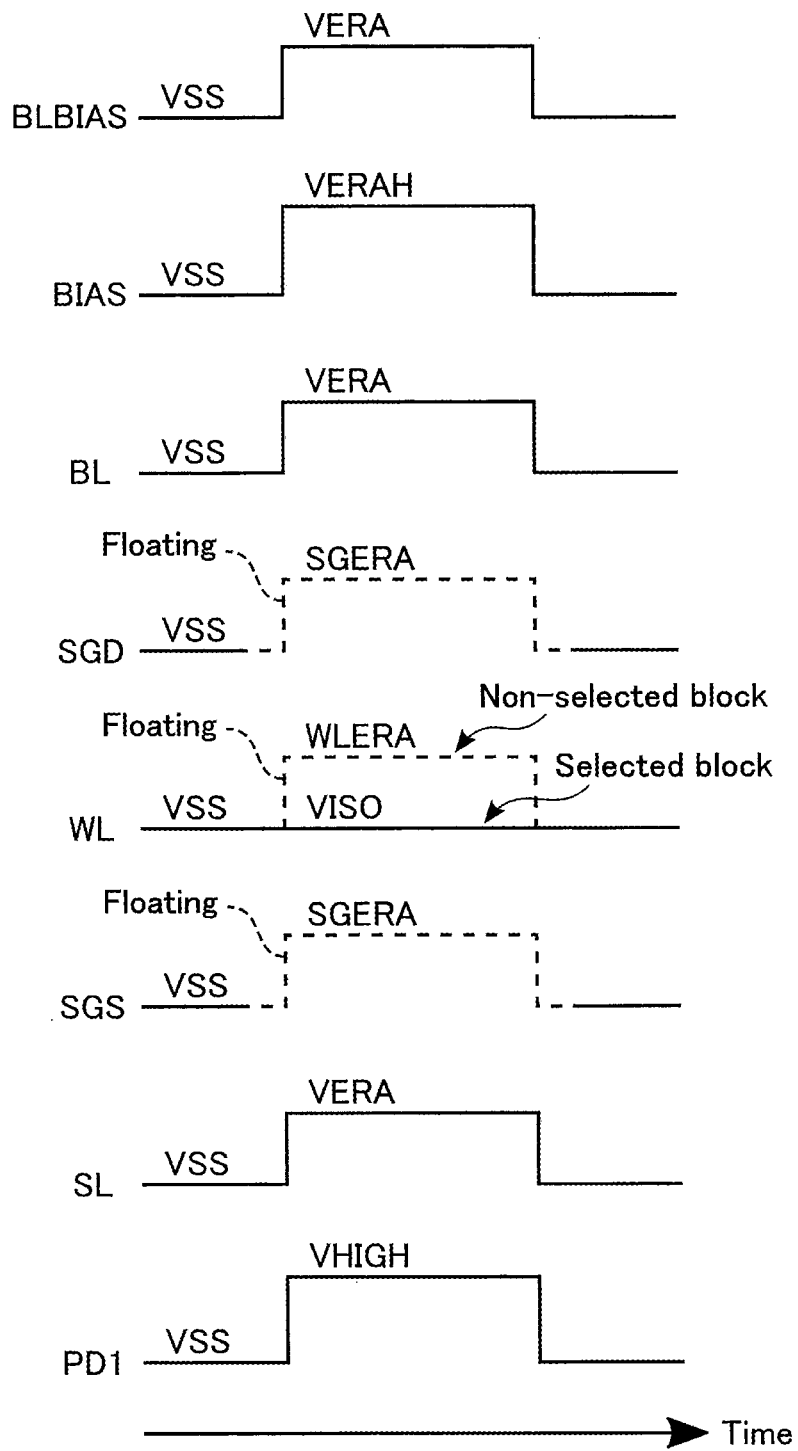
FIG. 22 is a timing chart of an exemplary erase operation of the semiconductor device according to the embodiment.

FIG. 22 is a timing chart of an exemplary erase operation of the semiconductor device 1 according to the embodiment. FIG. 22 shows exemplary voltages of the erase operation at the node BLBIAS, control signal BIAS, bit line BL, select gate line SGD, word line WL, select gate line SGS, source line SL, and pad PD1.

As illustrated in FIG. 22, the voltages at the node BLBIAS, control signal BIAS, bit line BL, select gate line SGD, word line WL, select gate line SGS, source line SL, and pad PD1 may be set to a ground voltage VSS before the erase operation. Once the erase operation is initiated, the sequencer 13 turns the transistor T8 into the OFF state to shut down the current path between the bit line BL and sense amplification section SA, thereby placing each of the select gate lines SGS and SGD and the word lines WL corresponding to the non-selected blocks BLK into a floating state.

Thereafter, the sequencer 13 raises the voltages of the node BLBIAS and source line SL to the erase voltage VERA and the voltage of the control signal BIAS to VERAH, while maintaining the word lines WL of the selected block BLK to VISO. VERA is a high voltage that is higher than. VSS and is used for the erase operation. VERAH is higher than VERA. VISO is lower than VERA, and may be the same voltage as VSS.

The transistor T9, with VERAH and VERA applied to its gate and drain, respectively, is turned to the ON state, and the voltage of the node BLBIAS is thereby sent to the bit line BL. This raises the voltage of the bit line BL to VERA, generating a high electric field in the bottom portions of the memory pillars MP. In a similar manner, with the voltage of the source line SL raised to VERA, a high electric field is formed in the upper portions of the memory pillars MP. As a result, in the vicinity of each of the selection transistors ST1 and ST2, positive holes are created through gate induced drain leakage (GIDL), and these positive holes are injected into the channels of the memory pillars MP.

Furthermore, in accordance with the increase in the voltages of the bit line BL and source line SL to VERA, the voltage of the channels (semiconductor layers 40) of the memory pillars MP increases. With the increase of the channel voltage, the voltages of the select gate lines SGD and SGS and the voltages of the word lines WL corresponding to the non-selected blocks BLK increase. The voltages of the select gate lines SGD and SGS are increased to SGERA, and the voltages of the word lines WL corresponding to the non-selected block BLK are increased to WLERA.

On the other hand, the voltages of the word lines WL corresponding to the selected block BLK are maintained at VISO, as a result of which a voltage difference is created between the control gates and channels of the memory cell transistors MT. In other words, a voltage gradient is created between a high voltage of the channels and a low voltage of the word lines WL. Thus, the positive holes of the channel are injected into the charge storage layer (insulating film 42) so that the electrons held in the charge storage layer based on the written data can be recombined with the injected positive holes.

As a result, the threshold voltage of the memory cell transistors MT is lowered, thereby erasing the data stored in the memory cell transistors MT. Thereafter, the sequencer 13 sets the voltages of the interconnect layers back to the state prior to the erase operation. As a result, the semiconductor device 1 according to the embodiment can erase the data stored in the memory cell transistors MT.

Paralleling the above erase operation, the semiconductor device according to the embodiment applies a voltage to the pad PD1. In particular, the memory controller 2 may apply a high voltage VHIGH, which is higher than the erase voltage VERA, to the pad PD1 during the erase operation of the semiconductor device 1. Then, the high voltage VHIGH is applied to the N-type well region DN of the CMOS chip CC. Upon application of the high voltage VHIGH to the N-type well region DN, electrons trapped in the transistor corresponding to the N-type well region DN can be removed.

The voltage applied to the pad PD1 during the erase operation should be higher at least than the voltage applied to the gate of the transistor HV. The structure for applying a high voltage VHIGH to the pad PD1 is not limited to the memory controller 2, and may be an externally coupled apparatus as long as the apparatus can operate synchronously with the operating timing of the semiconductor device 1. The operation of applying the high voltage VHIGH to the pad PD1 is not limited to the erase operation, but may be executed at any timing.

The application of a high voltage VHIGH to the N-type well region DN via the pad PD1 has been explained above. The structure for generating a high voltage VHIGH, however, may be any structure that can apply a voltage to the N-type well region DN. For example, a high voltage VHIGH generated by the driver module 15 may be applied to the N-type well region DN. If this is the case, the driver module 15 is connected to the N-type well region DN, via the contact CP and conductive layer 72, or in other words via the interconnect layers that run through the top surface of the CMOS chip CC.

[1-4] Effects of Present Embodiment

With the semiconductor device 1 according to the embodiment, the performance of transistors can be prevented from being lowered. The effects of the semiconductor device 1 according to the embodiment will be described in detail below.

In a semiconductor device, an N-type high breakdown voltage transistor formed on the semiconductor substrate is prone to deterioration of the performance due to hot carrier injection (HCI). The gate length of the N-type high breakdown voltage transistor is therefore designed with consideration for the HCI deterioration. For instance, the size of the N-type high breakdown voltage transistor is determined with some allowance to ensure a performance margin.

The hot carriers that may enter an N-type high breakdown voltage transistor can be removed by applying a high voltage to the N-type well region (deep N-well) arranged below this transistor. However, in order to apply a voltage to the N-type well region, contacts need to be prepared on the semiconductor substrate to pass beside the P-type well region in which the N-type high breakdown voltage transistor is formed. The formation of a circuit to prevent the adverse effect of the HCI may increase the chip area of the semiconductor device and may also increase production costs.

In contrast, the semiconductor device 1 according to the embodiment has a structure of two chips bonded to each other, in which a circuit including an N-type high breakdown voltage transistor is provided in one of the bonded chips that has pads PD. In the semiconductor substrate (P-type well region 60) in which this N-type high breakdown voltage transistor is provided, an N-type well region DN is arranged in a manner such that the region overlaps the transistor in planar view.

Furthermore, the semiconductor device 1 according to the embodiment having a bonded structure can make the semiconductor substrate of the CMOS chip CC thin. Thus, the conductive layer 72 is connected to the N-type well region DN from the back side of the CMOS chip CC (i.e., the top surface of the CMOS chip CC, or the top side of the semiconductor device 1 in FIG. 10). That is, the contact to the N-type well region DN is arranged in the area above the transistor HV, without passing beside the area of the P-type well region 60 in which the transistor HV is formed.

As a result of the above, the semiconductor device 1 according to the embodiment can apply a voltage to the N-type well region DN through the conductive layer 72, and can remove hot carriers injected into the N-type high breakdown voltage transistor. In other words, the semiconductor device 1 according to the embodiment can suitably recover the HCI deteriorated performance of a high breakdown voltage transistor.

Furthermore, with the conductive layer 72 connected from the back side of the CMOS chip CC, the range of the N-type well region DN formed in the P-type well region 60 can be reduced, omitting a contact CS in the CMOS chip CC. In other words, the semiconductor device 1 according to the embodiment reduces the area of the CMOS chip CC.

[2] Modification Example of Embodiment

The semiconductor device 1 according to a modification example of the embodiment will be discussed below. The semiconductor device 1 according to the modification example of the embodiment differs from the semiconductor device of the embodiment, in its N-type well region DN having a layer structure. FIG. 23 shows an exemplary cross-sectional structure of the pad region PR of the semiconductor device 1, similar to that of FIG. 10, according to the modification example of the embodiment. As illustrated in FIG. 23, the N-type well region DN may include a first diffusion layer 90, a second diffusion layer 91 and a third diffusion layer 92.

Each of the first diffusion layer 90, second diffusion layer 91 and third diffusion layer 92 includes N-type impurities. The concentrations of the doped N-type impurities decrease in the order of the first diffusion layer 90, second diffusion layer 91 and third diffusion layer 92. Thus, the concentration of the impurities in the N-type well region DN decreases as the depth of the semiconductor device 1 changes from the pad PD side toward the memory chip MC side. The first diffusion layer may have the concentration of the N-type impurities in the order of $10^{12}$.

The concentration of impurities designed to be gradient in the N-type well region DN in this manner enhances the controllability of etching at step S14 when forming a contact hole CH1. In particular, because of the first diffusion layer 90, second diffusion layer 91 and third diffusion layer 92 having different impurity concentrations, the progress of etching can be easily detected during the etching process for forming a contact hole CH1.

In the semiconductor device 1 according to the modification example of the embodiment, the precision of the connection can be enhanced between the conductive layer 72 and N-type well region DN, and any defect arising from the formation of the contact hole CH1 can be suppressed. That is, the semiconductor device 1 according to the modification example of the embodiment can reduce the difficulty of forming the contact hole CH1, which is required to reach the N-type well region DN, and can thereby improve yields of the semiconductor device 1.

The diffusion layers formed in the N-type well region DN are not limited to three layers, and any number of diffusion layers can be suitably designed. In the modification example of the embodiment, the impurities should be doped so as to demonstrate a gradient concentration at least in the Z direction in the N-type well region DN. Furthermore, each of the diffusion layers of the N-type well region DN should preferably have a thickness that is detectable with the end point detector (EPD) during the etching.

[3] Other Modification Examples

According to the embodiment, the semiconductor device 1 includes an N-type well region DN corresponding to a high breakdown voltage transistor in the pad region PR, but this is not a limitation. For example, the high breakdown voltage transistor in which an N-type well region DN is provided may be the transistors T8 and T9 in the sense amplifier region SR, or may be a transistor TR in the transfer regions XR. That is, an N-type well region DN and interconnect layers corresponding to the N-type well region DN are provided for any of the high breakdown voltage transistors in the CMOS chip CC.

According to the embodiment, the interconnect layers M0 to M2 are provided in the memory chip MC, while the interconnect layers D0 to D4 are provided in the CMOS chip CC. The number of interconnect layers, however, in each chip of the semiconductor device 1 can be freely determined.

According to the embodiment, the semiconductor device 1 is a NAND flash memory. The structure of this semiconductor device 1 is applicable to other semiconductor devices. That is, the semiconductor device 1 according to the embodiment should be configured with two chips bonded to each other, in which a contact to the N-type well region DN is formed from the back side of the CMOS chip CC.

According to the embodiment, a memory pillar MP may be two or more pillars coupled in the Z direction. Alternatively, a memory pillar MP may be a pillar corresponding to the select gate line SGD connected to a pillar corresponding to the word lines WL. The memory pillars MP and the contacts CV, CP, CS, C0 to C3, V1 and V2 may be tapered or reverse tapered, or may be bulged in the middle. In the same manner, the slits SLT may be tapered or reverse tapered, or may be bulged in the middle.

According to the embodiment, the stacked layers such as word lines WL form a stepped structure in the X direction in the hookup region HR, but this is not a limitation. The end portions of the stacked word lines WL and select gate lines SGD and SGS may be stepped in the Y direction. The end portions of the word lines WL and select gate lines SGD and SGS in the hookup region HR may be designed into a stepped structure having a desired number of rows. The stepped structure may differ among the select gate line SGS, word lines WL and select gate line SGD.

Throughout the specification, the "P-type well region" may denote a semiconductor substrate containing P-type impurities. Throughout the specification, the region in which impurities are newly doped into the semiconductor substrate (P-type well region) corresponds to an N-type well region DN or N-type semiconductor region NP. In the semiconductor substrate, P-type impurities may be further doped to the region where a transistor HV or the like is formed.

The term "connecting" throughout the specification refers to electrical connection, and therefore it may include connection by way of other elements. The expression "electrically connected" may be connecting components with an insulator interposed between if the components are able to operate in the same manner as when being electrically connected. A "pillar" refers to a structure arranged in a hole formed in the process of producing a semiconductor device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first chip including a first substrate, a first circuit and a first joint metal, the first circuit being provided on the first substrate, the first joint metal being connected to the first circuit;
   a second chip provided on the first chip, the second chip including a second substrate, a second circuit, and a second joint metal, the second substrate including a P-type well region and an N-type well region, the second circuit being provided on the second substrate and including a first transistor, the second joint metal being connected to the second circuit and the first joint metal; and
   a first conductor connected to the N-type well region from a top region of the second chip,
   wherein the P-type well region is arranged between a gate electrode of the first transistor and the N-type well region.

2. The device of claim 1, wherein the N-type well region does not encircle the P-type well region.

3. The device of claim 1, wherein the N-type well region is not in contact with a surface of the first substrate on which the first circuit is provided.

4. The device of claim 1, wherein the N-type well region is not in contact with a surface of the first substrate opposite a surface thereof on which the first circuit is provided.

5. The device of claim 1, wherein
   the second substrate includes first and second N-type semiconductor regions corresponding to a drain and a source of the first transistor, respectively, and
   the N-type well region is separated from the first and second N-type semiconductor regions.

6. The device of claim 1, wherein
   the N-type well region includes a first diffusion layer and a second diffusion layer provided on the first diffusion layer, and
   a concentration of N-type impurities in the second diffusion layer is higher than a concentration of N-type impurities in the first diffusion layer.

7. The device of claim 1, wherein the N-type well region includes phosphorus or arsenic.

8. The device of claim 1, further comprising a first insulating layer between the first conductor and the second substrate.

9. The device of claim 1, further comprising:
   a second conductor separated from the first conductor and provided to penetrate the second substrate; and
   a second insulating layer provided between the second conductor and the second substrate,
   wherein the second chip further includes a contact that is in contact with the second conductor.

10. The device of claim 1, further comprising a pad on the first conductor.

11. The device of claim 10, wherein the pad includes aluminum.

12. The device of claim 10, wherein a first voltage and a second voltage are applied to the gate electrode and the first conductor, respectively, at a first time point, and the second voltage is higher than the first voltage.

13. The device of claim 1, wherein the first joint metal and the second joint metal each include copper.

14. The device of claim 1, wherein the first joint metal and the second joint metal are bonded to each other.

15. The device of claim 1, wherein the first chip further includes a plurality of third conductors and a pillar, the third conductors are separated from each other above the first substrate, the pillar is provided to penetrate the third conductors, intersecting portions of the pillar and the third conductors function as memory cells, and one of the third conductors is electrically connected to the first joint metal.

16. The device of claim 15, wherein
   the second chip further includes a row decoder on the second substrate, and
   the row decoder is electrically connected to the second joint metal.

17. A method of manufacturing a semiconductor device, comprising:
   forming a first chip including a first circuit;
   forming a second chip including a second circuit;
   bonding the first chip and the second chip to each other;
   doping N-type impurities into a region above a first transistor included in the second circuit;
   forming a hole that reaches the region doped with the N-type impurities from a surface of the second chip after bonding the first chip and the second chip; and
   forming a first conductor in the hole.

18. The method of claim 17, wherein bonding the first chip and the second chip includes:
   bringing a plurality of first joint metals included in the first chip into contact respectively with a plurality of second joint metals included in the second chip, and
   performing a thermal process after bringing the first joint metals into contact with the second joint metals.

19. A method of manufacturing a semiconductor device, comprising:
   forming a first chip including a first circuit;

forming a second chip including a second circuit that includes a first transistor after doping N-type impurities into a substrate, in such a manner as to overlap a region doped with the N-type impurities;

bonding the first chip and the second chip to each other;

forming a hole that reaches the region doped with the N-type impurities from a surface of the second chip, after bonding the first chip and the second chip; and forming a first conductor in the hole.

20. The method of claim 19, wherein bonding the first chip and the second chip includes:

bringing a plurality of first joint metals included in the first chip into contact respectively with a plurality of second joint metals included in the second chip; and performing a thermal process after bringing the first joint metals into contact with the second joint metals.

* * * * *